(12) United States Patent
Akahoshi et al.

(10) Patent No.: US 10,896,871 B2
(45) Date of Patent: Jan. 19, 2021

(54) CIRCUIT BOARD, METHOD FOR MANUFACTURING CIRCUIT BOARD, AND ELECTRONIC DEVICE

(71) Applicant: FUJITSU LIMITED, Kawasaki (JP)

(72) Inventors: Tomoyuki Akahoshi, Atsugi (JP); Masaharu Furuyama, Chigasaki (JP); Daisuke Mizutani, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 26 days.

(21) Appl. No.: 16/163,778

(22) Filed: Oct. 18, 2018

(65) Prior Publication Data
US 2019/0051598 A1 Feb. 14, 2019

Related U.S. Application Data

(63) Continuation of application No. PCT/JP2016/062507, filed on Apr. 20, 2016.

(51) Int. Cl.
*H01L 23/522* (2006.01)
*H01G 4/228* (2006.01)
(Continued)

(52) U.S. Cl.
CPC ......... *H01L 23/5223* (2013.01); *H01G 4/228* (2013.01); *H01G 4/33* (2013.01);
(Continued)

(58) Field of Classification Search
CPC . H01L 23/5223; H01L 23/481; H01L 23/498; H01L 28/40; H01L 2224/16225;
(Continued)

(56) References Cited

U.S. PATENT DOCUMENTS

2003/0097750 A1   5/2003   Okabe et al.
2003/0215619 A1   11/2003  Ooi et al.
(Continued)

FOREIGN PATENT DOCUMENTS

JP   2003-158378 A   5/2003
JP   2003-332752 A   11/2003
(Continued)

OTHER PUBLICATIONS

International Search Report and Written Opinion of the International Searching Authority (Form PCT/ISA/210, 220, Form PCT/ISA/237, and Translation of Written Opinion), mailed in connection with PCT/JP2016/062507 and dated Jul. 12, 2016 (16 pages).
(Continued)

*Primary Examiner* — Dzung Tran
(74) *Attorney, Agent, or Firm* — Fujitsu Patent Center

(57) ABSTRACT

A circuit board includes an insulating layer; a capacitor which is provided in the insulating layer and includes a dielectric layer, a first conductor layer provided on a first surface of the dielectric layer and including a first opening part, and a second conductor layer provided on a second surface opposite to the first surface of the dielectric layer and including a second opening part at a position corresponding to the first opening part; a first conductor via provided in the insulating layer, penetrating the dielectric layer, the first opening part and the second opening part, and being smaller than the first opening part and the second opening part in plan view; a second conductor via provided in the insulating layer and making contact with the second conductor layer; and a third conductor layer provided on the insulating layer and electrically coupled to the first and the second conductor vias.

10 Claims, 16 Drawing Sheets

(51) Int. Cl.
    *H01L 23/498*     (2006.01)
    *H01G 4/33*     (2006.01)
    *H05K 1/16*     (2006.01)
    *H01L 23/48*     (2006.01)
    *H01L 49/02*     (2006.01)
    *H05K 1/11*     (2006.01)
    *H05K 3/46*     (2006.01)

(52) U.S. Cl.
    CPC .......... *H01L 23/481* (2013.01); *H01L 23/498* (2013.01); *H01L 28/40* (2013.01); *H05K 1/115* (2013.01); *H05K 1/16* (2013.01); *H05K 1/162* (2013.01); *H01L 2224/16225* (2013.01); *H05K 1/113* (2013.01); *H05K 3/4602* (2013.01); *H05K 2201/0175* (2013.01); *H05K 2201/0187* (2013.01); *H05K 2201/092* (2013.01); *H05K 2201/0959* (2013.01)

(58) Field of Classification Search
    CPC .......... H01G 4/228; H01G 4/33; H05K 1/115; H05K 1/16; H05K 1/162; H05K 1/113; H05K 2201/0175; H05K 2201/0187; H05K 2201/092; H05K 2201/0959
    USPC ........................................................ 257/532
    See application file for complete search history.

(56) References Cited

U.S. PATENT DOCUMENTS

| | | |
|---|---|---|
| 2006/0245139 A1 | 11/2006 | Kariya |
| 2007/0105278 A1 | 5/2007 | Kariya et al. |
| 2007/0146980 A1* | 6/2007 | Ahn ...................... H01G 4/1218 361/762 |
| 2008/0100986 A1* | 5/2008 | Sohn ...................... H01G 4/228 361/301.1 |
| 2009/0046409 A1* | 2/2009 | Kweon ................... H05K 1/162 361/303 |
| 2009/0188703 A1* | 7/2009 | Ito ........................... H01L 24/19 174/255 |
| 2012/0307469 A1 | 12/2012 | Oka et al. |
| 2013/0088811 A1* | 4/2013 | Takeshima .............. H01L 28/40 361/311 |
| 2013/0149464 A1 | 6/2013 | Rokuhara et al. |

FOREIGN PATENT DOCUMENTS

| | | |
|---|---|---|
| JP | 2006-210776 A | 8/2006 |
| JP | 2006-286842 A | 10/2006 |
| JP | 2012-253195 A | 12/2012 |
| JP | 2013-122999 A | 6/2013 |
| JP | 2015-18988 A | 1/2015 |
| JP | 2015-053350 A | 3/2015 |
| WO | 2006/001505 A1 | 1/2006 |

OTHER PUBLICATIONS

JPOA—Japanese Office Action dated Jan. 29, 2019 for corresponding Japanese Patent Application No. 2018-512706 with machine translation.

\* cited by examiner

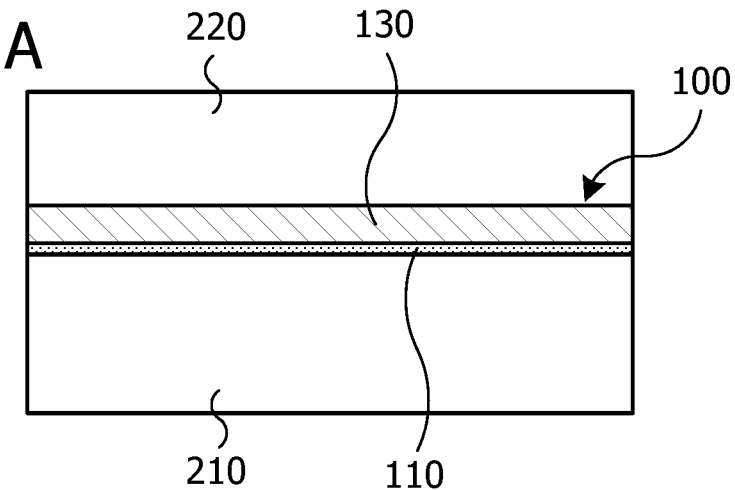
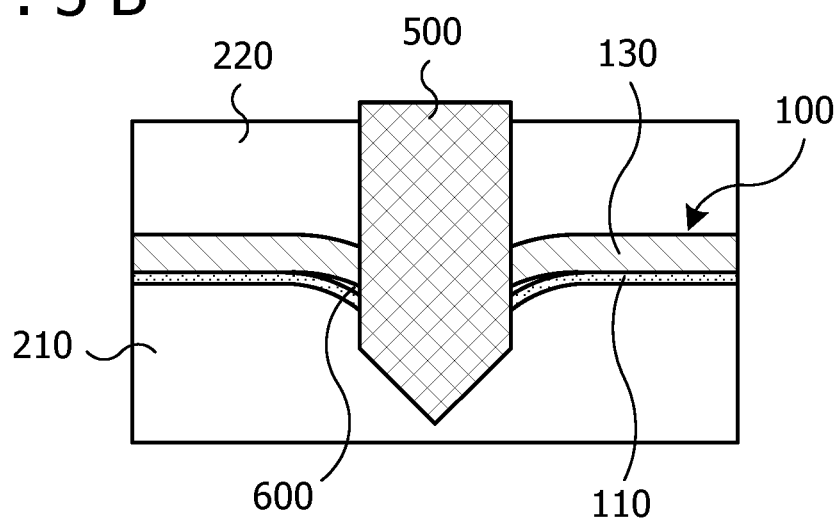
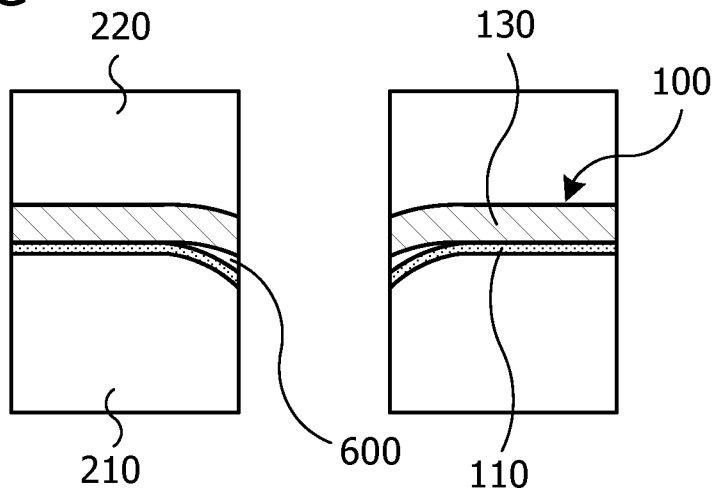

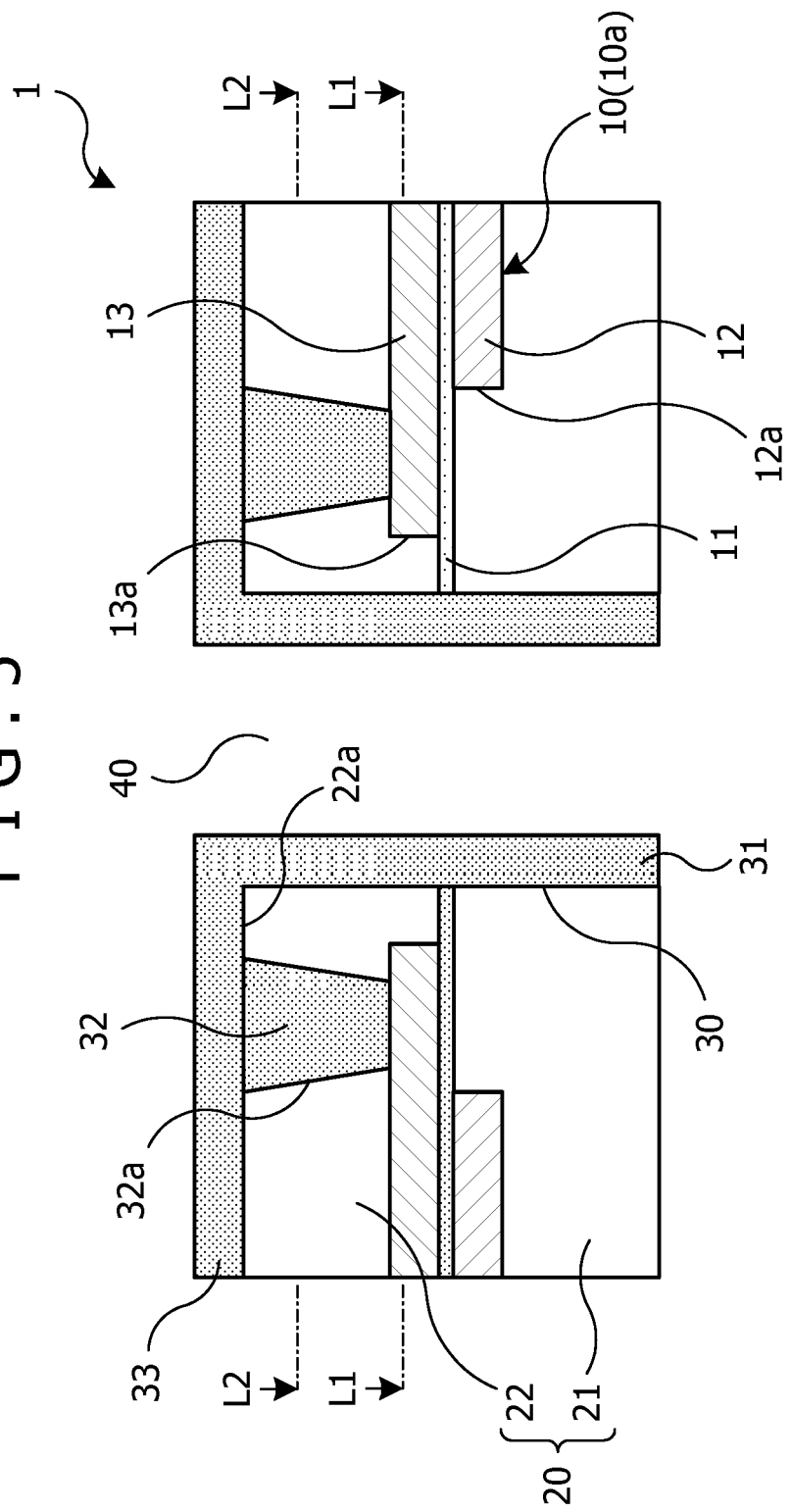

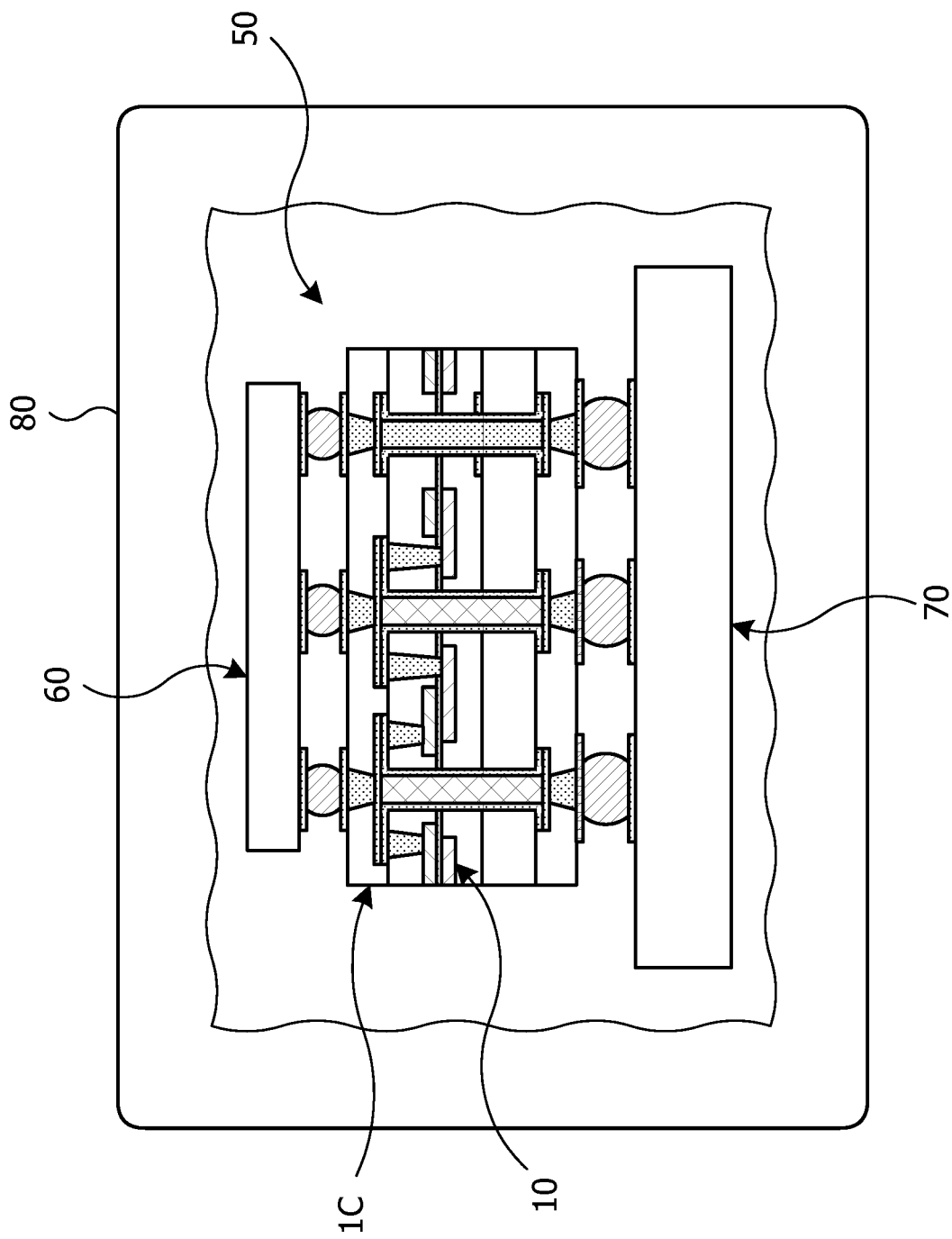

CIRCUIT BOARD, METHOD FOR MANUFACTURING CIRCUIT BOARD, AND ELECTRONIC DEVICE

CROSS-REFERENCE TO RELATED APPLICATIONS

This application is a continuation application of International Application PCT/JP2016/062507 filed on Apr. 20, 2016 and designated the U.S., the entire contents of which are incorporated herein by reference.

FIELD

The embodiments discussed herein are related to a circuit board, a method for manufacturing a circuit board, and an electronic device.

BACKGROUND

There has been a technology in which a capacitor is incorporated in a circuit board. A capacitor has a structure in which a dielectric layer using a given material is sandwiched between a pair of conductor layers. In relation to the circuit board incorporating the capacitor, there has been a technology in which, for interlayer coupling inside the circuit board, a conductor via is provided which penetrates the capacitor while making contact with the dielectric layer and one of the pair of conductor layers sandwiching the dielectric layer therebetween. In addition, there has been also a technology in which a conductor via is provided which penetrates the capacitor in a non-contact relation with the dielectric layer and at least one of the pair of conductor layers sandwiching the dielectric layer therebetween. The conductor via is provided in the circuit board by forming a hole penetrating a given part of the capacitor and forming a conductor via material in the hole.

Examples of related-art documents are Japanese Laid-open Patent Publication No. 2006-210776 and Japanese Laid-open Patent Publication No. 2015-18988.

SUMMARY

According to an aspect of the embodiments, a circuit board includes an insulating layer; a capacitor which is provided in the insulating layer and includes a dielectric layer, a first conductor layer provided on a first surface of the dielectric layer and including a first opening part, and a second conductor layer provided on a second surface opposite to the first surface of the dielectric layer and including a second opening part at a position corresponding to the first opening part; a first conductor via provided in the insulating layer, penetrating the dielectric layer, the first opening part and the second opening part, and being smaller than the first opening part and the second opening part in plan view; a second conductor via provided in the insulating layer and making contact with the second conductor layer; and a third conductor layer provided on the insulating layer and electrically coupled to the first conductor via and the second conductor via.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 3A, 38 and 3C are illustrations of a hole forming process forming a circuit board;

FIGS. 4A, 48 and 4C are illustrations of a conductor via forming process and a heating process in forming a circuit board;

FIG. 5 is a figure (first one) illustrating an example of a circuit board according to a first embodiment;

FIGS. 8A, 86, 8C and 8D are figures (first ones) illustrating an example of a method for forming the circuit board according to the first embodiment;

FIG. 16 is a figure illustrating an example of electronic apparatus according to the fifth embodiment.

DESCRIPTION OF EMBODIMENTS

In recent years, in regard of semiconductor devices such as semiconductor chips and semiconductor packages to be mounted on electronic devices and electronic apparatuses, increases in performance, operation speed and current and a decrease in voltage have been under way. For a stable operation of such a semiconductor device, it is important to restrain variations in power supply voltage and to remove high-frequency noises. Therefore, with respect to a circuit board on which to mount a semiconductor device, a reduction in power supply impedance is requested.

As one of techniques for reducing the power supply impedance, there has been known a technique of mounting a chip capacitor on the circuit board, and coupling the chip capacitor between a power supply line and a ground (GND) line of the circuit board. From the viewpoint of shortening the wiring length from the semiconductor device to the capacitor and, suppressing an inductance component of the wiring, there have been known a technique of incorporating a chip capacitor in a circuit board and a technique of incorporating a capacitor (thin film capacitor) formed by a dielectric layer and a pair of conductor layers sandwiching the dielectric layer therebetween.

A circuit board incorporating a capacitor will be described. The circuit board incorporating a capacitor includes a capacitor including a structure in which a dielectric layer is sandwiched between a pair of conductor layers, in an insulating layer. One of the pair of conductor layers is set to a power supply potential, while the other is set to a GND potential, and the one and the other are electrically coupled to a power supply terminal and a GND terminal for external coupling of the circuit board.

In the circuit board incorporating a capacitor, a conductor via which penetrates a capacitor provided in an insulating layer may be provided for interlayer coupling inside the circuit board. The circuit board including such a conductor via is formed, for example, using a method as follows.

FIGS. 1A, 1B, 1C and 1D and FIGS. 2A and 2B are figures illustrating an example of a method for forming a circuit board. In FIGS. 1A to 1D and FIGS. 2A and 2B, a section of a major part in each process in forming the circuit board is illustrated schematically.

Figure 1A:
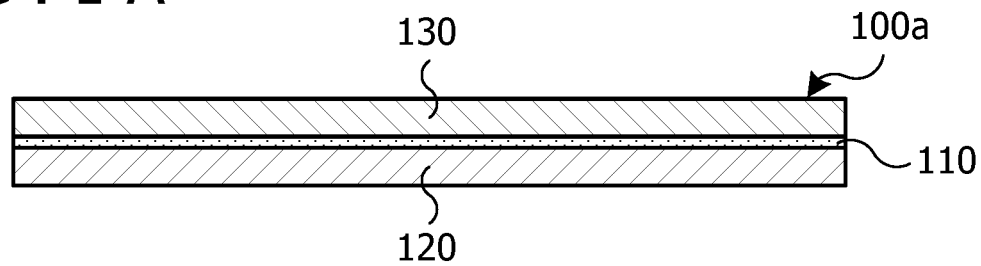
FIGS. 1A, 1B, 1C and 1D are figures (first ones) illustrating an example of a method for forming a circuit board.

First, a capacitor board 100a in which a dielectric layer 110 is sandwiched between a pair of a conductor layer (electrode layer) 120 and a conductor layer (electrode layer) 130 as illustrated in FIG. 1A is prepared. The capacitor board 100a is obtained, for example, by forming the dielectric layer 110 on the electrode layer 130 on one side and forming thereon the electrode layer 120 on the other side. Various dielectric materials may be used for the dielectric layer 110, and various conductor materials may be used for the electrode layer 120 and the electrode layer 130. A ceramic material such as barium titanate ($BaTiO_3$; BTO) is used for the dielectric layer 110, and a metallic material such as copper (Cu) and nickel (Ni) is used for the electrode layer 120 and the electrode layer 130.

Figure 1B:
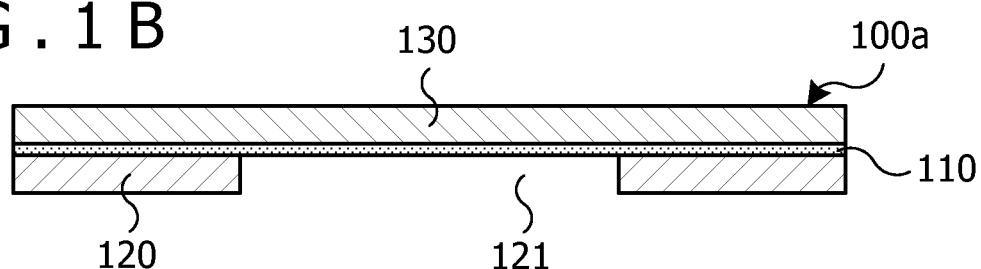

The electrode layer 120 and the electrode layer 130 of the capacitor board 100a are patterned into respective given shapes. The patterning of the electrode layer 120 and the electrode layer 130 is performed, for example, by etching. In FIG. 1B is illustrated an example in which the electrode layer 120 is formed with an opening part 121 in a region including a position where to form a conductor via 310 (or a hole 300 for forming thereof) to be described later.

Figure 1C:
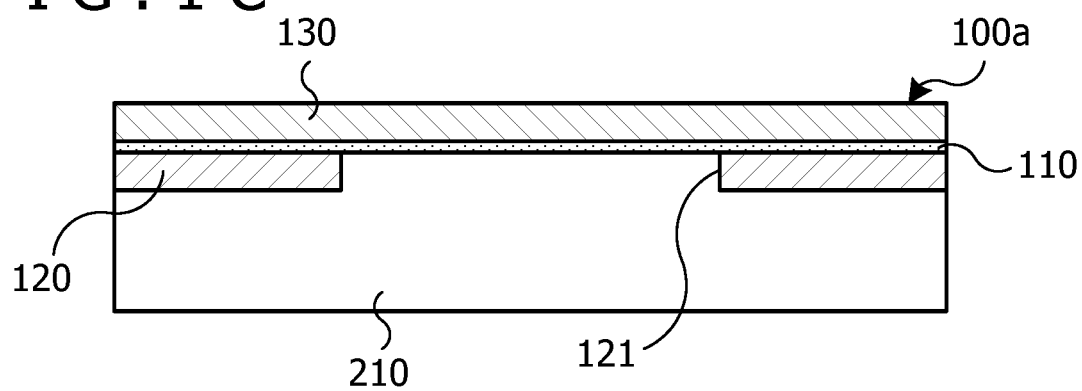

The capacitor board 100a after the patterning is united with the insulating layer 210, as illustrated in FIG. 1C. The insulating layer 210 is an insulating layer of a resin, a prepreg or the like, an insulating layer using an epoxy resin or the like, which is provided on a base board including one or a plurality of wiring layers. Onto such an insulating layer 210, the capacitor board 100a is adhered under heating and pressurizing (thermocompression bonded), whereby the capacitor board 100a is united with the insulating layer 210.

Figure 1D:
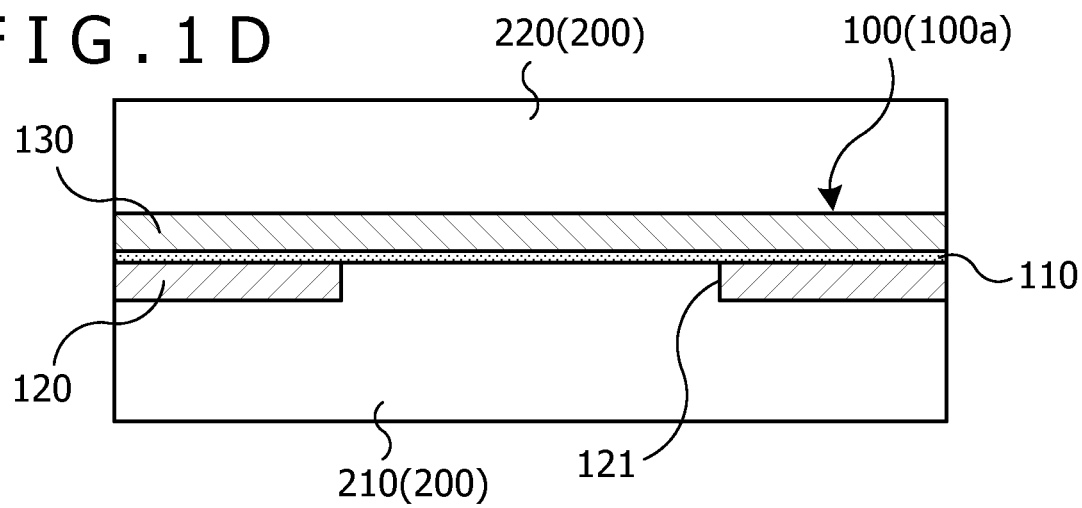

The capacitor board 100a united with the insulating layer 210 is formed with an insulating layer 220, as illustrated in FIG. 1D. The insulating layer 220 is an insulating layer of a resin, a prepreg or the like, an insulating layer using an epoxy resin or the like. Such an insulating layer 220 is thermocompression bonded onto the capacitor board 100a on the insulating layer 210. This results in that the capacitor board 100a united with the insulating layer 210 is covered by the insulating layer 220.

For example, the method as illustrated in FIGS. 1A to 1D is used, to form a basic structure of a circuit board in which the capacitor 100 (capacitor board 100a) is incorporated in the insulating layer 210 and the insulating layer 220 (insulating layer 200).

Figure 2A:
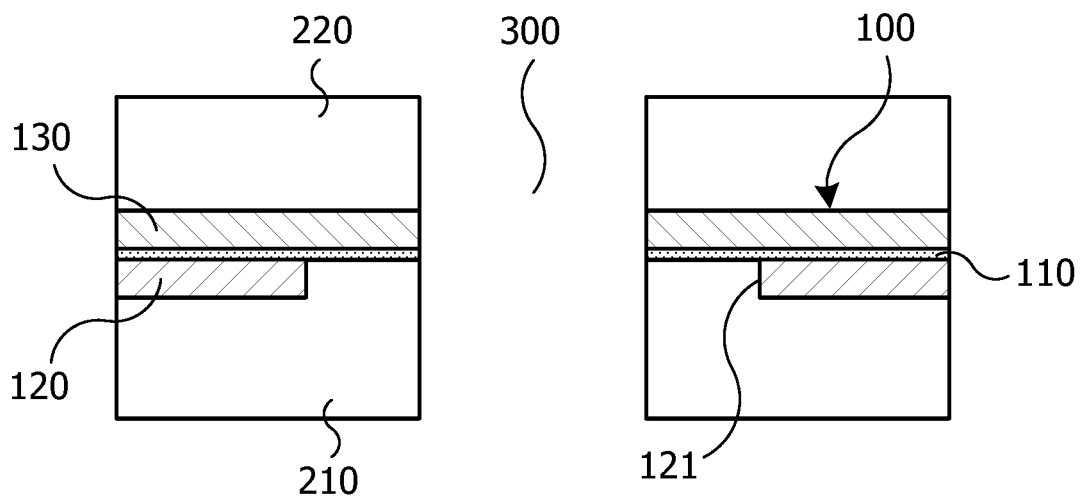
FIGS. 2A and 2B are figures (second ones) illustrating an example of a method for forming a circuit board.

In the case of providing the circuit board with a conductor via penetrating the incorporated capacitor 100, for interlayer coupling inside the circuit board, a hole 300 penetrating the capacitor 100 is first formed, as illustrated in FIG. 2A. The hole 300 is formed by laser processing or drilling.

The hole 300 is formed in such a manner as, for example, to penetrate the circuit board or to reach a part of a wiring layer provided on the base board the insulating layer 210 side.

The hole 300 is formed at the position of the opening part 121 of the electrode layer 120 formed precedingly, in an opening size smaller than that of the opening part 121 (in a size smaller than the opening part 121 in plan view). For example, at the time of patterning (FIG. 1B) of the electrode layer 120, the opening part 121 is larger in opening size than the hole 300. Of the dielectric layer 110, the electrode layer 120 and, the electrode layer 130 of the capacitor 100, the dielectric layer 110 and the electrode layer 130 on one side are exposed at an inner wall of the hole 300, as illustrated in FIG. 2A.

Figure 2B:
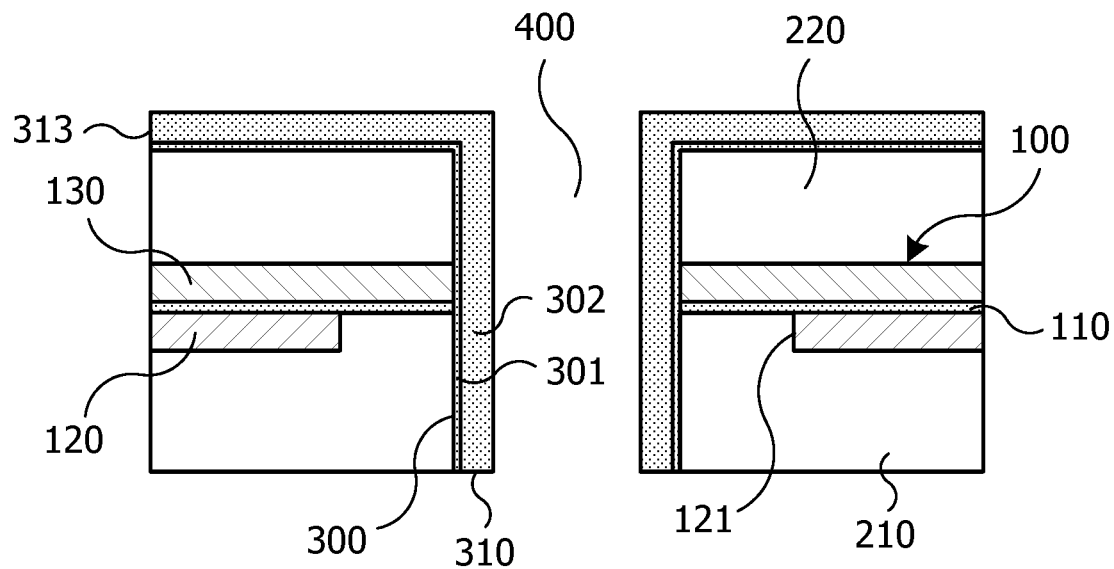

After the formation of the hole 300, a conductor material is formed on the inner wall of the hole 300, and the conductor via 310 is formed, as illustrated in FIG. 2B. Various conductor materials, for example, a metallic material such as Cu, may be used for the conductor via 310. The conductor via 310 is obtained, for example, by first forming a conductor layer (seed layer) 301 by electroless plating, and then forming a conductor layer (plating layer) 302 by electroplating using the seed layer 301 as a current supplying layer.

When the conductor via 310 is formed on the inner wall of the hole 300, the seed layer 301 and the plating layer 302 are formed also on an upper surface of the insulating layer 220. The seed layer 301 and the plating layer 302 formed on the upper surface of the insulating layer 220 are used as part (conductor layer 313) of wiring coupled to the conductor via 310, of the circuit board.

As illustrated in FIG. 2B, the conductor via 310 provided on the inner wall of the hole 300 makes contact with the dielectric layer 110 and the electrode layer 130 of the capacitor 100 which are exposed at the inner wall at the time of formation of the hole 300. This results in that the conductor via 310 penetrating the capacitor 100 and the electrode layer 130 of the capacitor 100 are electrically coupled. The conductor via 310 and the electrode layer 130 of the capacitor 100 thus coupled are set to a power supply potential or a GND potential. Of the capacitor 100, the electrode layer 120 on another side which is provided with the opening part 121 and is not coupled to the conductor via 310 is set to a potential different from that of the electrode layer 130 coupled to the conductor via 310. By the conductor via 310, an interlayer coupling structure for electrically coupling a plurality of layers inclusive of the capacitor 100, in the circuit board, is formed.

As illustrated in FIG. 2B, for example, in a central area of the hole 300 formed with the conductor via 310 on the inner wall thereof, a cavity 400 is left, after the formation of the conductor via 310. The cavity 400 may be filled with a resin (not illustrated) such as an epoxy resin. While a conformal via formed on the inner wall of the hole 300 is illustrated here as an example of the conductor via 310, a filled via in which the hole 300 is filled with a conductor material may be formed.

While illustration is omitted, a so-called build-up process may be carried out in which an insulating layer of a resin or the like is laminated on the insulating layer 220 side and the insulating layer is formed with a conductor via and a conductor layer, after the process of FIG. 2B. Such a build-up process is conducted one time or repeated multiple times, whereby a circuit board including a desired number of wiring layers is obtained.

Other than the above, a so-called collective lamination process of laminating one or a plurality of boards including an insulating layer of a resin or the like and a conductor layer patternedly formed thereon on the capacitor 100 side may, for example, be conducted after the process of FIG. 1D, thereby obtaining a circuit board including a desired number of wiring layers. In this case, after the collective lamination, process, the formation of the hole 300 is conducted as illustrated in FIG. 2A, and the formation of the conductor via 310 is performed as illustrated in FIG. 2B.

The method as above, for example, is used to form the conductor via 310 penetrating the capacitor 100, and an interlayer coupling structure of the circuit board by the conductor via 310 is realized. As another method for obtaining an interlayer coupling structure of a circuit board, there is a so-called multi-stage laser processing method in which each layer laminated is subjected respectively to formation of a hole by laser processing and formation of a conductor material in the hole, whereby a conductor via for electrically coupling the layers is formed.

When the method for collectively forming the hole 300 in the plurality of layers (FIG. 2A) and forming the conductor via 310 in the hole 300 (FIG. 2B) as above is used, simplification of the circuit board formation and enhancement of the efficiency thereof may be realized, as compared to the case where the multi-stage laser processing method is used. When the formation of the hole 300 is conducted by drilling, the hole 300 may be formed in a given opening diameter and in a desired depth, and enhancement of the degree of freedom in design in multilayer formation of a circuit board may be realized.

Figure 4A:
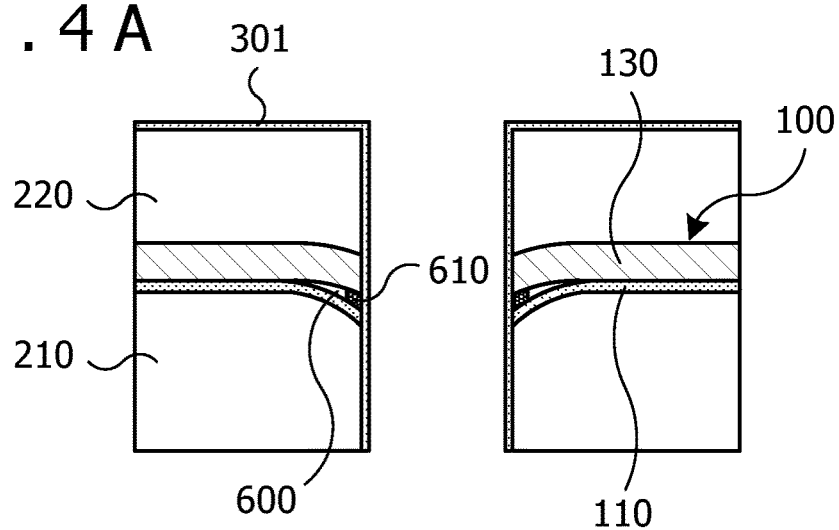
Figure 4B:
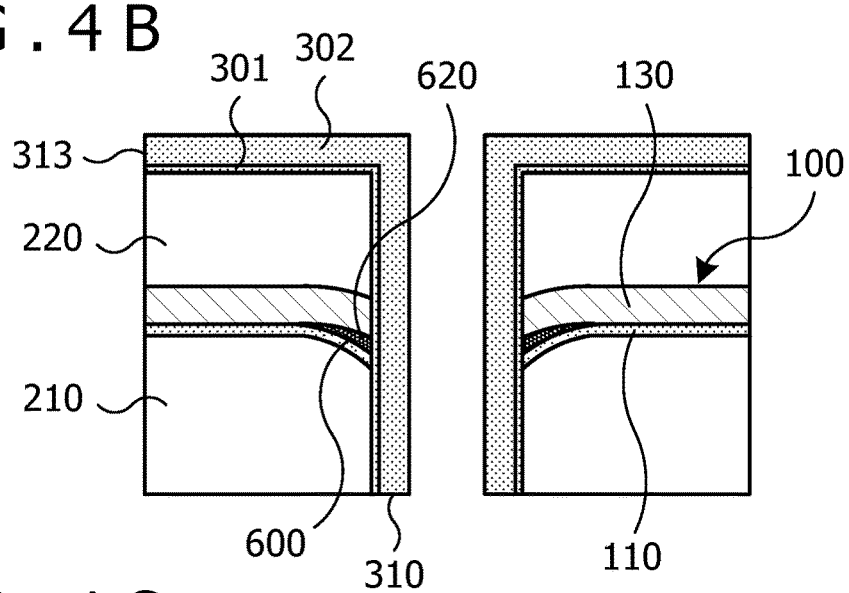
Figure 4C:
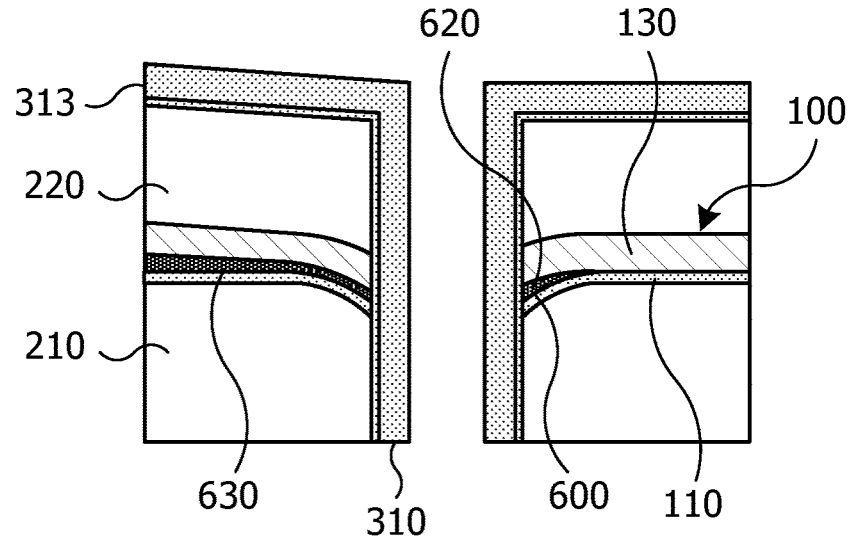

On the other hand, in the method for forming the hole 300 by drilling, situations as illustrated in FIGS. 3A, 3B and 3C and FIGS. 4A, 4B and 4C may occur. FIGS. 3A, 3B and 3C are illustrations of a hole forming process in forming a circuit board, and FIGS. 4A, 4B and 4C are illustrations of a conductor via forming process and a heating process in forming a circuit board. FIG. 3A illustrates schematically a section of a major part before hole formation. FIG. 3B illustrates schematically a section of a major part during the hole formation and FIG. 3C illustrates schematically a section of a major part after the hole formation. FIG. 4A illustrates schematically a section of a major part in an electroless plating process. FIG. 4B illustrates schematically a section of a major part in an electroplating process, and FIG. 4C illustrates schematically a section of a major part in a heating process.

As illustrated in FIG. 3A, for forming a laminate (FIG. 1D) of the insulating layer 210, the capacitor 100 and the insulating layer 220 with the hole 300 for the conductor via 310, hole formation by use of a drill 500 as depicted in FIG. 3B is conducted. The hole formation by use of the drill 500 is carried out, for example, from the insulating layer 220 side, in such a manner that the hole formed penetrates the insulating layer 220, the electrode layer 130 and the dielectric layer 110 of the capacitor 100, and the insulating layer 210. The hole formation is conducted at the position of the opening part 121 formed in the electrode layer 120 of the capacitor 100, as illustrated in FIG. 2A. In FIGS. 3A, 3B and 3C and FIGS. 4A, 4B and 4C, the electrode layer 120 is not illustrated (the opening part 121 thereof is illustrated). At the inner wall of the hole 300 formed by the drill 500, there are exposed the insulating layer 220, the electrode layer 130, the dielectric layer 110 and the insulating layer 210, as illustrated in FIG. 3B.

When the hole formation is thus conducted using the drill 500, stress at the time of the processing deforms the electrode layer 130, and the dielectric layer 110 is deformed attendant on the deformation of the electrode layer 130, as illustrated in FIGS. 3B and 3C. Due to such deformations of the electrode layer 130 and the dielectric layer 110 and, further, to differences in physical properties of the layers, adhesion properties and the like, a crack 600 as depicted in FIGS. 3B and 3C may be generated between the electrode layer 130 and the dielectric layer 110.

When electroless plating is performed in a state in which such a crack 600 has been generated, as illustrated in FIG. 4A, the crack 600 may be left without being filled with a plating solution 610 of the electroless plating or with the seed layer 301 formed. When electroplating is further conducted as depicted in FIG. 4B after the electroless plating, a plating solution 620 may enter into the crack 600 left. Alternatively, the crack 600 may remain as void even after the electroplating. The plating solution 620 having entered into the crack 600 or the void remaining in the crack 600 may be enclosed in the crack 600 through a process in which the inner wall of the hole 300 is closed with the seed layer 301 formed by the electroless plating and the plating layer 302 formed by the electroplating, for example, the conductor via 310.

When the circuit board after the formation of the conductor via 310 is heated due to application of heat at the time of a test or in practical use in a state in which the plating solution 620 or the void is left in the crack 600, the plating solution 620 or the void (a gas inside thereof) remaining in the crack 600 may expand. When the plating solution 620 or the void in the crack 600 thus expands due to heating, as illustrated in FIG. 4C, exfoliation 630 may be generated between the electrode layer 130 and the dielectric layer 110 of the capacitor 100, with the crack 600 at the inner wall of the hole 300 as a starting point. The exfoliation 630 generated between the electrode layer 130 and the dielectric layer 110 would cause a lowering in capacitance of the capacitor 100.

Thus, when the method for forming the hole 300 by drilling is used, the crack 600 generated between the electrode layer 130 and the dielectric layer 110 and the exfoliation 630 arising therefrom may lower the reliability and performance of the capacitor 100 and the circuit board incorporating the capacitor 100.

A case in which drilling is applied to a laminated part of the electrode layer 130 and the dielectric layer 110 present at a position corresponding to the opening part 121 of the electrode layer 120 has been described here as an example. The same as above applies also to a case in which drilling is applied to a laminated part of the dielectric layer 110 and the electrode layer 120 present at a position corresponding to the opening part of the electrode layer 130. In this case, also, the crack and exfoliation generated between the dielectric layer 110 and the electrode layer 120 due to the drilling may cause a lowering in the reliability and performance of the capacitor 100 and the circuit board incorporating the capacitor 100.

Taking the above-mentioned points into consideration, the lowering in the reliability and performance of the circuit board incorporating the capacitor due to heating is restrained by use of techniques as described in the embodiments below. First, a first embodiment will be described.

Figure 6:
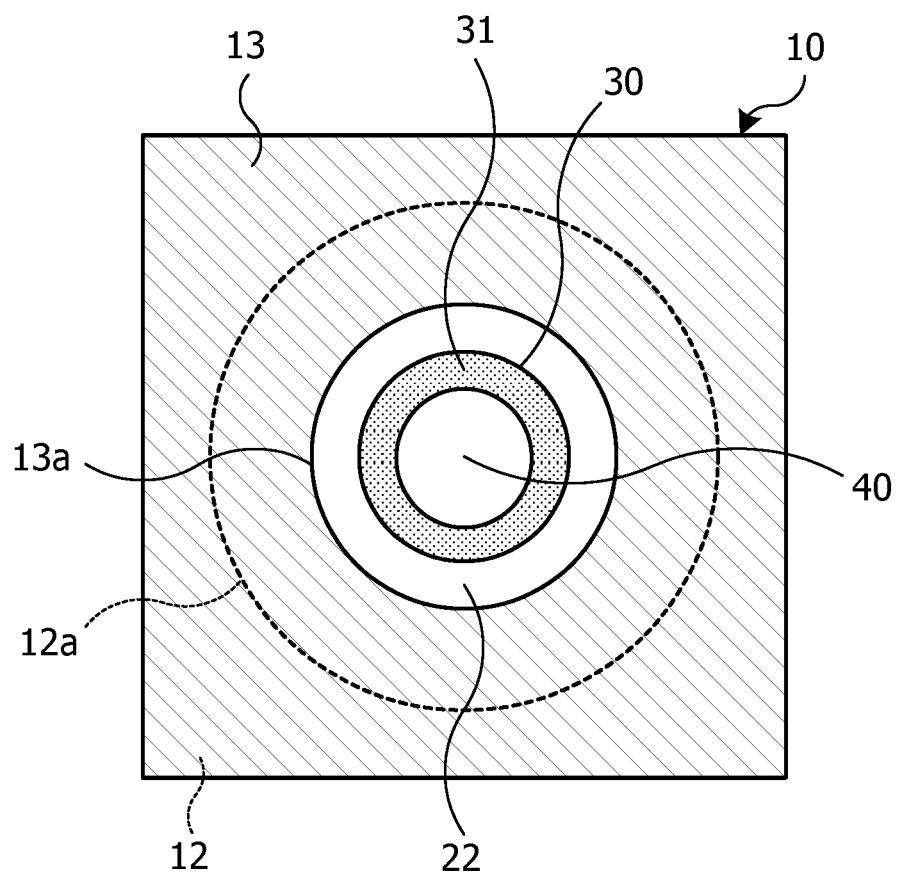
FIG. 6 is a figure (second one) illustrating an example of the circuit board according to the first embodiment.
Figure 7A:
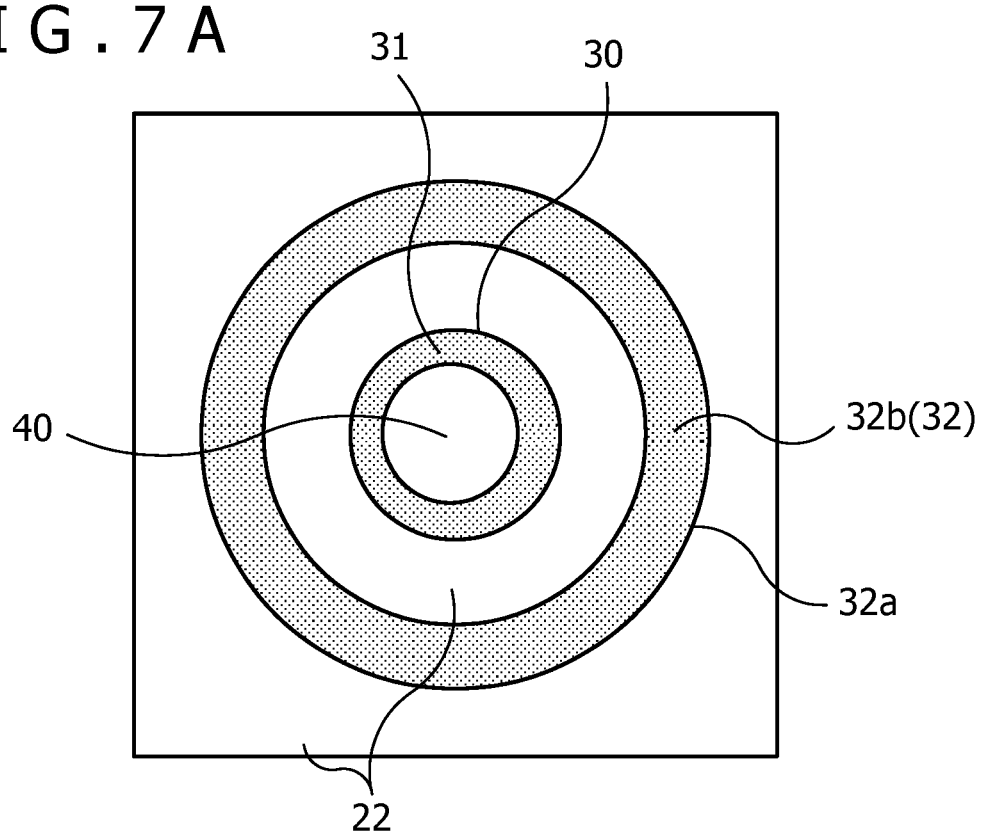
FIGS. 7A and 7B are figures (third ones) illustrating an example of the circuit board according to the first embodiment.
Figure 7B:
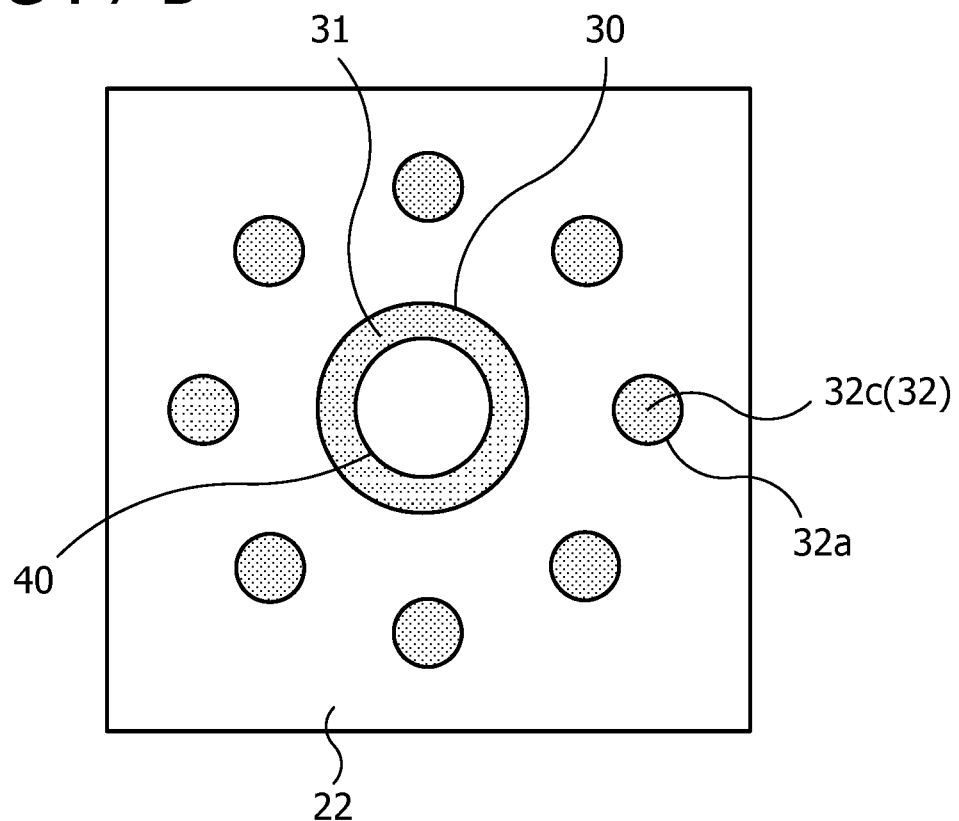

FIGS. 5 to 7A and 7B are figures illustrating an example of a circuit board according to the first embodiment. FIG. 5 illustrates schematically a section of a major part of the circuit board according to the first embodiment. FIG. 6 illustrates schematically a plane as viewed along arrow line L1-L1 of FIG. 5. FIG. 7A illustrates schematically an example of a plane as viewed along arrow line L2-L2 of FIG. 5, and FIG. 7B illustrates schematically another example of the plane as viewed along arrow line L2-L2 of FIG. 5.

A circuit board 1 illustrated in FIG. 5 includes an insulating layer 20 (an insulating layer 21 and an insulating layer 22), and a capacitor 10 (capacitor board 10a) provided in the insulating layer 20. The circuit board 1 further includes a conductor via 31 provided in a hole 30 penetrating the insulating layer 20 and the capacitor 10, a conductor via (coupling via) 32 coupled to the capacitor 10, and a conductor layer 33 coupled to the conductor via 31 and the coupling via 32.

The capacitor 10 includes a dielectric layer 11, and a pair of a conductor layer (electrode layer) 12 and a conductor layer (electrode layer) 13 sandwiching the dielectric layer 11 therebetween. Various dielectric materials may be used for the dielectric layer 11. For example, a ceramic material is used for the dielectric layer 11. As the ceramic material for the dielectric layer 11, various high dielectric materials such as BTO may be used. As the ceramic material for the dielectric layer 11, there may be used high dielectric materials such as barium strontium titanate ($Ba_xSr_{1-x}TiO_3$; BSTO) obtained by addition of strontium (Sr) to BTO, strontium titanate ($SrTiO_3$; STO), lead zirconate titanate ($Pb(Zr,Ti)O_3$; PZT), and lanthanum added PZT (PLZT). The thickness of the dielectric layer 11 is, for example, 1 to 3 µm.

For the electrode layer 12 and the electrode layer 13, various conductor materials may be used. For example, a metallic material or materials are used for the electrode layer 12 and the electrode layer 13. As the metallic material for the electrode layer 12, there may be used Cu, Ni and the like. The thicknesses of the electrode layer 12 and the electrode layer 13 are, for example, 15 to 30 µm. The electrode layer 12 and the electrode layer 13 are respectively patterned into given shapes. The electrode layer 12 includes an opening part 12a in a region including the position at which to form the conductor via 31 or the hole 30. The electrode layer 13 also includes an opening part 13a in a region including the position at which to form the conductor via 31 or the hole 30. The electrode layer 12 and the electrode layer 13 are provided respectively with the opening part 12a and an opening part 13a at positions corresponding to each other. The opening part 12a and the opening part 13a differing in opening size are illustrated here as an example. The opening part 12a and the opening part 13a may be the same or comparable in opening size, and an increase in the area of facing parts of the electrode layer 12 and the electrode layer 13 makes it possible to increase capacitance.

The capacitor 10 may be obtained by forming the dielectric layer 11 (for example, a layer containing BTO as a main constituent) on the electrode layer 13 on one side (for example, a layer containing Ni as a main constituent), and forming thereon the electrode layer 12 on the other side (for example, a layer containing Cu as a main constituent), as will be described later. The capacitor 10 obtained in this way is formed on the insulating layer 21, and the insulating layer 22 is formed on the capacitor 10, as will be described later.

The insulating layer 21, as that part of the insulating layer 20 which is provided under the capacitor 10, is, for example, an insulating layer of a resin, a prepreg or the like, which is provided on a base board including one or a plurality of wiring layers. For the insulating layer 21, there may be used resin materials such as epoxy resin, polyimide resin, and bismaleimide-triazine resin, or such a resin material in which glass or other fibers or cloth is contained. For the insulating layer 22, as that part of the insulating layer 20 which is provided on the capacitor 10, also, there may, be used resin materials such as epoxy resin, polyimide resin, and bismaleimide-triazine resin, or such a resin material in which glass or other fibers or cloth is contained.

The hole 30 is formed in such a manner as to penetrate the insulating layer 22, the capacitor 10 and the insulating layer 21. The hole 30 is formed at the position of the opening part 12a of the electrode layer 12 and the opening part 13a of the electrode layer 13, in an opening size smaller than those of the opening part 12a and the opening part 13a (in a size smaller than the opening part 12a and the opening part 13a in plan view). For example, the electrode layer 12 and the electrode layer 13 are preliminarily formed with the opening part 12a and the opening part 13a in opening sizes larger than that of the hole 30 to be formed. Therefore, of the dielectric layer 11, the electrode layer 12 and the electrode layer 13 of the capacitor 10, only the dielectric layer 11 is exposed at the inner wall of the hole 30. For example, a hole 30 which is circular in plan view and has an opening size of 50 to 300 µm in diameter is provided.

The conductor via 31 is provided in the hole 30. For the conductor via 31, various conductor materials may be used. For example, a metallic material is used for the conductor via 31. As the metallic material for the conductor via 31, there may be used Cu and the like. The conductor via 31 is formed by use of a plating method, as will be described later. Since the electrode layer 12 and the electrode layer 13 of the capacitor 10 are not exposed at the inner wall of the hole 30 as aforementioned, the conductor via 31 is directly coupled with neither of the electrode layer 12 and the electrode layer 13 of the capacitor 10. The conductor via 31 is, for example a conformal via which is provided on the inner wall of the hole 30, with the cavity 40 left in central area. The cavity 40 may be filled with a resin (not illustrated).

A schematic figure in a plane as viewed along arrow line L1-L1 along plane directions of the electrode layer 13 of the capacitor 10 is illustrated in FIG. 6. In FIG. 6, the opening part 12a of the electrode layer 12 of the capacitor 10 is indicated by dotted line. The opening part 13a of the electrode layer 13 smaller in opening size than the opening part 12a of the electrode layer 12 is provided at a position corresponding to the opening part 12a. The conductor via 31 is located on the inner side of edges of the opening part 12a and the opening part 13a, of the electrode layer 12 and the electrode layer 13 and is not in contact with either of the electrode layer 12 and the electrode layer 13.

While the conductor via 31, the opening part 12a and the opening part 13a which are circular in planar outer shape are illustrated as an example in FIG. 6, the outer shapes of the conductor via 31, the opening part 12a and the opening part 13a are not limited to the circular planar shape. The outer shapes of the conductor via 31, the opening part 12a and the opening part 13a may be any of various planar shapes, provided that a structure in which the conductor via 31 on the inner wall of the hole 30 makes contact with neither of the electrode layer 12 and the electrode layer 13 of the capacitor 10 is ensured.

As illustrated in FIG. 5, the conductor layer 33 coupled to the conductor via 31 provided in the hole 30 is provided on the upper surface 22a of the insulating layer 22. For the conductor layer 33, various conductor materials may be used. For example, a metallic material is used for the conductor layer 33. As the metallic material for the conductor layer 33, there may be used Cu and the like. The conductor layer 33 is formed, for example, simultaneously with the conductor via 31 when the conductor via 31 is formed on the inner wall of the hole 30 by use of a plating method, as will be described later.

As illustrated in FIG. 5, the coupling via 32 coupled to the electrode layer 13 on one side of the capacitor 10 and to the conductor layer 33 on the insulating layer 22 on the capacitor 10 is provided in the insulating layer 22. For the coupling via 32, various conductor materials may be used. For example, a metallic material is used for the coupling via 32. As the metallic material for the coupling via 32, there may be used Cu and the like. The coupling via 32 is formed, for example, by subjecting the insulating layer 22 on the capacitor 10 to laser processing, and filling a hole 32a formed thereby in the insulating layer 22 with a conductor material, before the formation of the conductor layer 33 or of the conductor layer 33 and the conductor via 31, as will be described later.

Schematic figures in plane as viewed along arrow line L2-L2 of the insulating layer 22 provided with the coupling via 32 are illustrated in FIGS. 7A and 7B. The coupling via 32 is a continuous conductor wall 32b provided in such a manner as to surround the conductor via 31 in the hole 30, as illustrated in FIG. 7A, for example. Alternatively, the coupling via 32 includes a plurality of (here, as an example, eight) conductor vias 32c provided in such a manner as to surround the conductor via 31 in the hole 30, as illustrated in FIG. 7B, for example. In the insulating layer 22, the hole or holes 32a are formed in a shape according to the form of the coupling via 32, or the form of the conductor wall 32b or the group of conductor vias 32c.

While the conductor wall 32b and the group of conductor vias 32c which are circular in planar outer shape are illustrated as an, example in FIGS. 7A and 7B, the outer shapes of the conductor wall 32b and the group of conductor vias 32c are not limited to the circular planar shape. The outer shapes of the conductor wall 32b and the group of conductor vias 32c may be any of various planar shapes, provided that the electrode layer 13 of the capacitor 10 and the conductor layer 33 on the insulating layer 22 are electrically coupled.

As has been described above, in the circuit board 1, a structure is adopted in which the electrode layer 12 and the electrode layer 13 of the capacitor 10 are not exposed at the inner wall of the hole 30 where the conductor via 31 is formed, and the conductor via 31 is not directly coupled with either the electrode layer 12 or the electrode layer 13 of the capacitor 10 in the hole 30. Of the capacitor 10, the electrode layer 13 on one side is electrically coupled to the conductor via 31 in the hole 30 through the coupling via 32 in the insulating layer 22 and the conductor layer 33 on the insulating layer 22. In the circuit board 1, the electrode layer 13 on one side of the capacitor 10 is set to a given potential by the conductor via 31, the conductor layer 33 and the coupling via 32.

The coupling via 32 may be configured to include the conductor wall 32b as illustrated in FIG. 7A or the group of the conductor vias 32c as depicted in FIG. 7B, or may be a single columnar conductor via, provided that the conductor via 31 and the conductor layer 33 and the electrode layer 13 of the capacitor 10 may be electrically coupled. It is to be noted, however, that when the coupling via 32 is configured to include the conductor wall 32b or the group, of conductor vias 32c as above-mentioned, the area of contact between the coupling via 32 and the conductor layer 33 is comparatively large. This enables realization of, for example, a reduction in the electric resistance between the coupling via 32 and the conductor layer 33, and stabilization of the potential of the electrode layer 13 of the capacitor 10.

The circuit board 1 as above-described is formed, for example, by a method as follows. FIGS. 8A, 8B, 8C and 8D to 10A and 10B are figures illustrating an example of a method for forming the circuit board according to the first embodiment. FIGS. 8A to 8D, 9A and 9B, and 10A and 10B each illustrate schematically a section of a major part in each process in forming the circuit board according to the first embodiment.

Figure 8A:
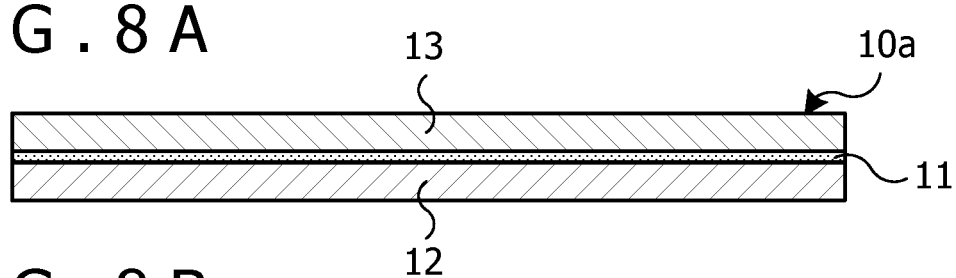

The capacitor board 10a in which the dielectric layer 11 is sandwiched between a pair of the electrode layer 12 and the electrode layer 13 as depicted in FIG. 8A is first prepared. The capacitor board 10a is obtained, for example, by a process in which the dielectric layer 11 containing BTO as a main constituent is sinteredly formed on the electrode layer 13 on one side containing Ni as a main constituent, and the electrode layer 12 on the other side containing Cu as a main constituent is coveringly formed thereon.

Figure 8B:
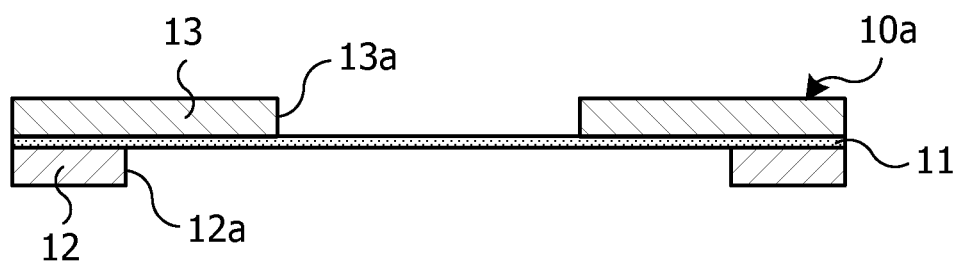

The electrode layer 12 and the electrode layer 13 of the capacitor board 10a are respectively patterned into given shapes, by etching, for example. In FIG. 8B, there is depicted an example in which the electrode layer 12 is formed with the opening part 12a, and the electrode layer 13 is formed with the opening part 13a, by patterning. The opening part 12a and the opening part 13a are both formed in a region including the position where to form the hole 30 and the conductor via 31.

Figure 8C:
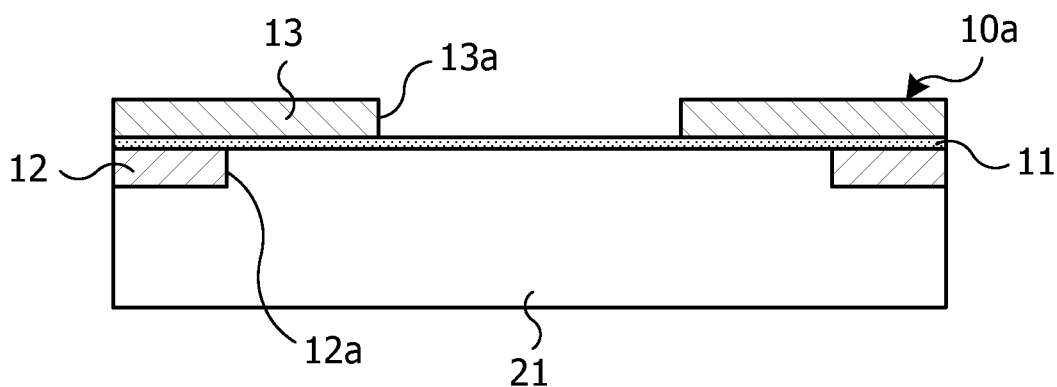

The capacitor board 10a after the patterning is united with the insulating layer 21 formed using a resin or the like, as illustrated in FIG. 8C. The capacitor board 10a is united with the insulating layer 21, for example, by thermocompression bonding onto the insulating layer 21, with the electrode layer 12 side thereof facing the insulating layer 21 side.

Figure 8D:
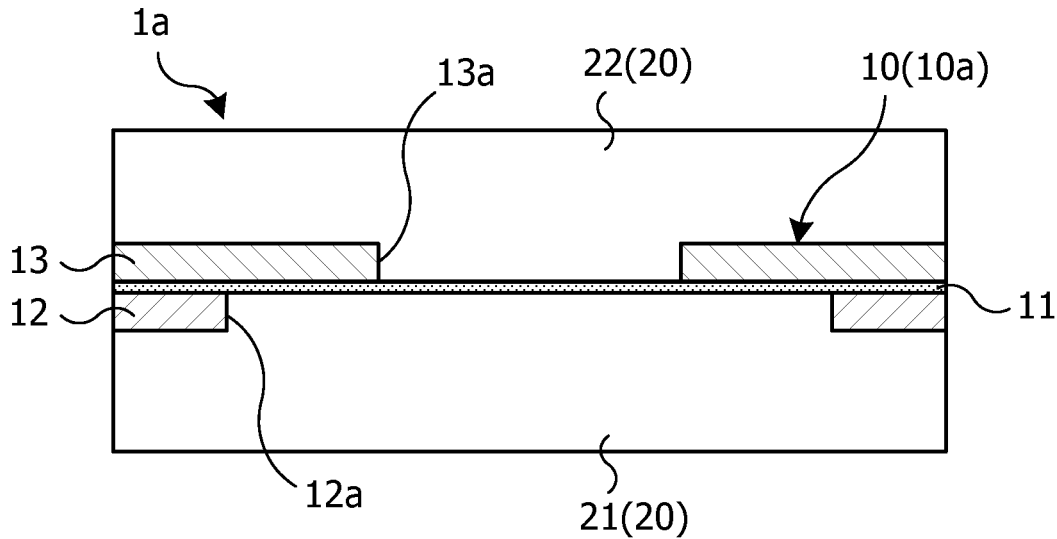

On the capacitor board 10a united with the insulating layer 21, the insulating layer 22 using a resin or the like is further formed, as depicted in FIG. 8D. The insulating layer 22 is, for example, thermocompression bonded onto the capacitor board 10a provided on the insulating layer 21, thereby being united with the insulating layer 21 and the capacitor board 10a.

For example, the method as illustrated in FIGS. 8A to 8D is used to form a board 1a incorporating the capacitor 10 (capacitor board 10a) in the insulating layer 21 and the insulating layer 22 (the insulating layer 20).

Figure 9A:
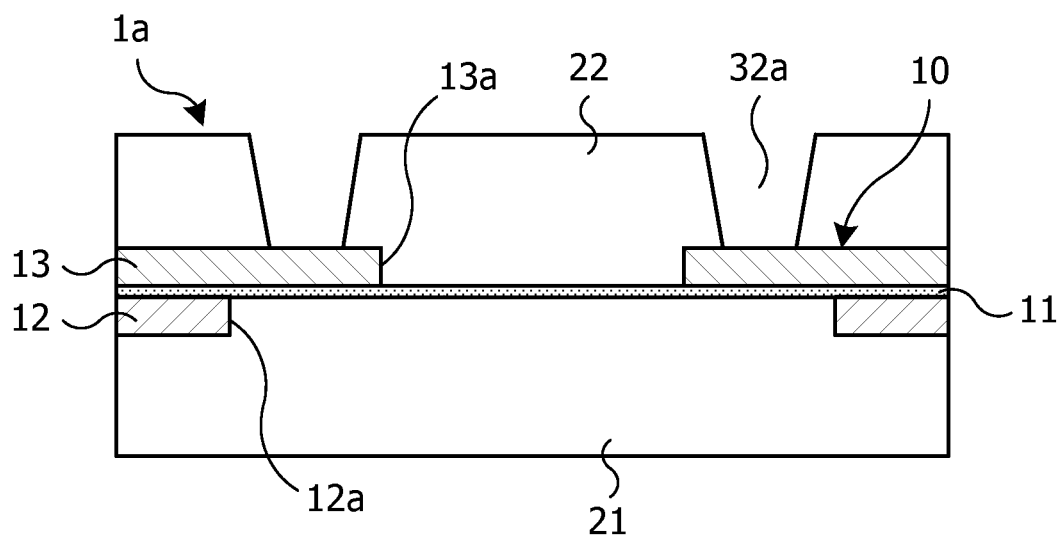
FIGS. 9A and 9B are figures (second ones) illustrating an example of the method for forming the circuit board according to the first embodiment.

After the formation of the board 1a as depicted in FIG. 8D, a hole 32a reaching the electrode layer 13 of the capacitor 10 is formed, as illustrated in FIG. 9A. The hole 32a is formed by, for example, laser processing, for example, processing using carbon dioxide gas laser ($CO_2$ laser), applied to the insulating layer 22 on the capacitor 10.

Figure 9B:
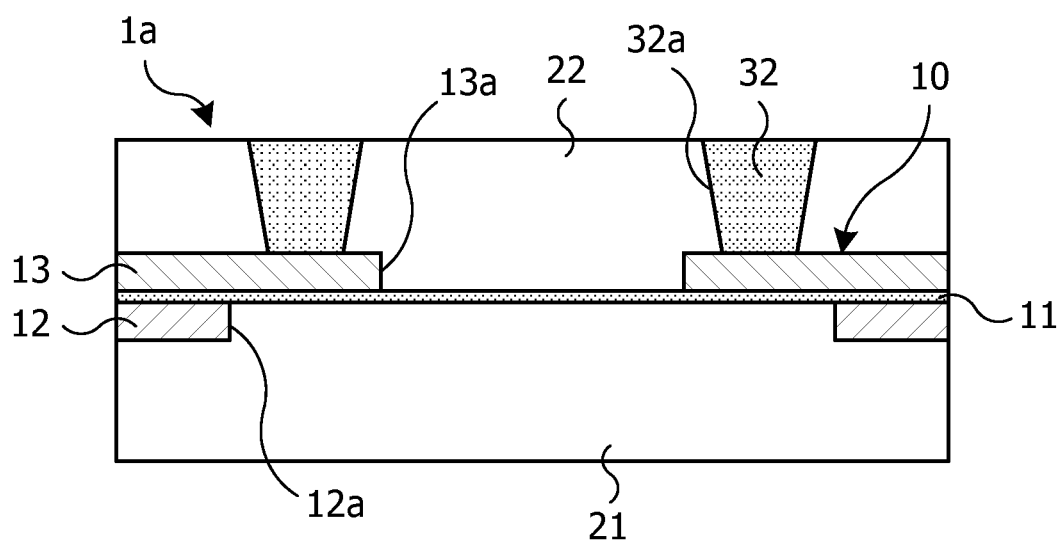

After the formation of the hole 32a in the insulating layer 22, the hole 32a formed is filled with a conductor material such as Cu, to form the coupling via 32, as depicted in FIG. 9B. For example, the coupling via 32 is formed in the hole 32a by electroless plating and electroplating.

Figure 10A:
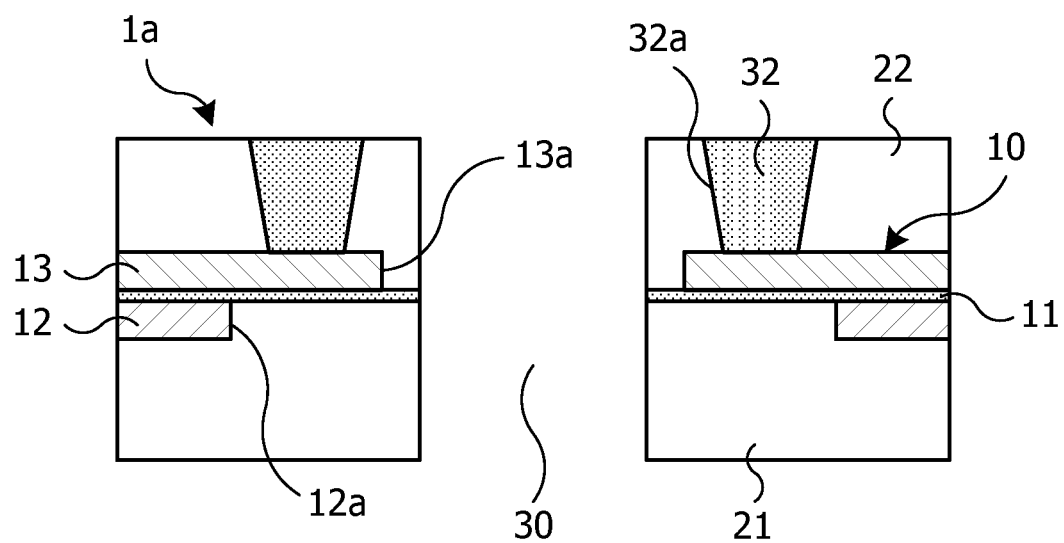
FIGS. 10A and 10B are figures (third ones) illustrating an example of the method for forming the circuit board according to the first embodiment.

After the formation of the coupling via 32, a hole 30 penetrating the insulating layer 22, the capacitor 10 and the insulating layer 21 is formed, as depicted in FIG. 10A. The hole 30 is formed at the position of the opening part 12a and the opening part 13a provided in the electrode layer 12 and the electrode layer 13 of the capacitor 10, in an opening size smaller than those of the opening part 12a and the opening part 13a.

The hole 30 is formed by drilling. In the drilling, the insulating layer 22, the dielectric layer 11 of the capacitor 10, and the insulating layer 21 are cut by a drill, to form the hole 30. Since the opening part 12a of the electrode layer 12 and the opening part 13a of the electrode layer 13 of the capacitor 10 are larger in opening size than the hole 30 to be formed, the electrode layer 12 and the electrode layer 13 are suppressed from being cut by the drill. For this, reason, deformation of the electrode layer 130 and the dielectric layer 110 thereunder and generation of the crack 600 between the electrode layer 130 and the dielectric layer 110, as depicted in FIGS. 3A, 3B and 3C and FIGS. 4A, 4B and 4C are restrained from being generated due to stress at the time of drilling.

The adhesion between the dielectric layer 11 and the insulating layer 21 and the insulating layer 22 is higher than the adhesion between the dielectric layer 11 and the electrode layer 13, so that even when the insulating layer 22, the dielectric layer 11 and the insulating layer 21 are subjected to drilling, generation of a crack between the dielectric layer 11 and the insulating layer 21 and the insulating layer 22 is restrained.

Figure 10B:
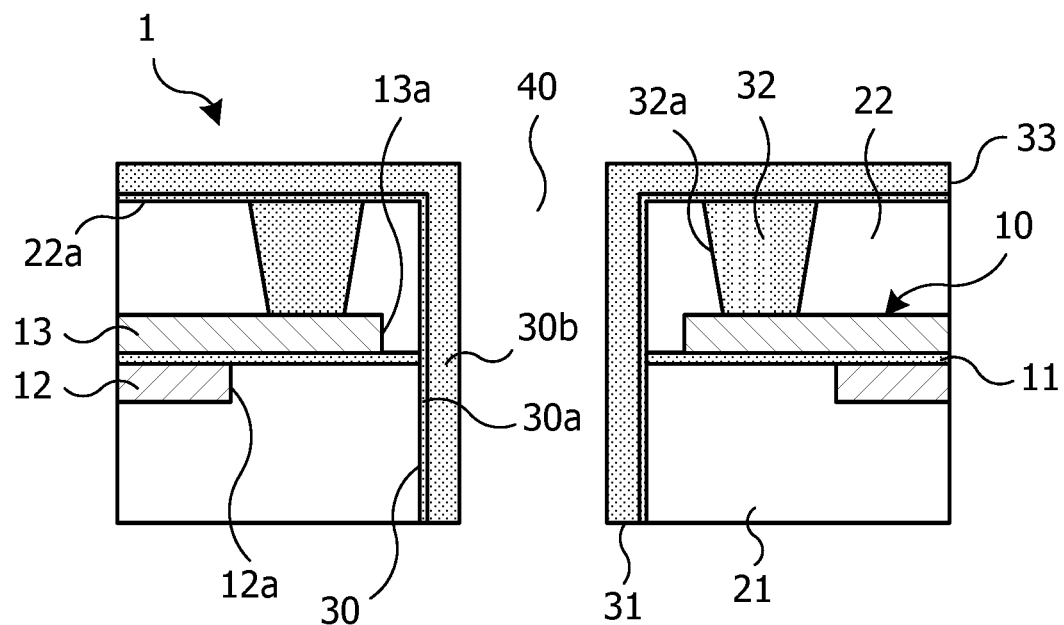

After the formation of the hole 30, a conductor material such as Cu is formed on the inner wall of the hole 30, to form the conductor via 31, as depicted in FIG. 10B. For example, a conductor layer (seed layer) 30a is first formed by electroless plating, and a conductor layer (plating layer) 30b is then formed by electroplating in which the seed layer 30a is used as a current supply layer. This results in that the conductor via 31 is formed on the inner wall of the hole 30.

At the time of formation of the conductor via 31, the seed layer 30a and the plating layer 30b are formed on the upper surface 22a of the insulating layer 22 in addition to on the inner wall of the hole 30, as illustrated in FIG. 10B. This enables the formation of the conductor layer 33 on the upper surface 22a of the insulating layer 22. The conductor layer 33 may be patterned into a given shape. By the conductor layer 33 on the insulating layer 22, electrical coupling between the conductor via 31 in the hole 30 and the coupling via 32 in the insulating layer 22 is provided.

The conductor via 31 is formed on the inner wall of the hole 30, and is formed as a conformal via in which the cavity 40 is left in a central area. In this case, the cavity 40 may be filled with a resin (not illustrated) such as epoxy resin. The hole 30 may be filled with a conductor material, to form a filled via.

The circuit, board 1 is formed by the above-mentioned processes. In the circuit board 1, the electrode layer 12 and the electrode layer 13 of the capacitor 10 are provided with the opening part 12a and the opening part 13a larger than the conductor via 31, at the position where to form the conductor via 31 or the hole 30. For this reason, even in the case where the hole 30 for forming the conductor via 31 is formed by drilling, the electrode layer 12 and the electrode layer 13 are suppressed from being cut, so that generation of a crack between the dielectric layer 11 and the electrode layer 12 and the electrode layer 13 is restrained.

The conductor via 31 in the hole 30 is electrically coupled to one of the electrode layer 12 and the electrode layer 13 of the capacitor 10, in, this example, the electrode layer 13. The electrical coupling between the electrode layer 13 of the capacitor 10 and the conductor via 31 in the hole 30 is realized by the coupling via 32 which is formed in the insulating layer 22 in such a manner as to be coupled to the electrode layer 13 and the conductor layer 33 which is formed on the insulating layer 22 and coupled to the conductor via 31 in the hole 30.

Since generation of a crack between the dielectric layer 11 and the electrode layer 12 and the electrode layer 13 is restrained, in the circuit board 1, penetration of a plating solution into such a crack at the time of forming the conductor via 31 in the hole 30 by use of a plating method is restrained. Since the generation of a crack and the penetration of the plating solution into such a crack are restrained, it is ensured that even when the circuit board 1 is heated at the time of a tester during practical use, expansion of the plating solution in the crack and the resulting exfoliation between the dielectric layer 11 and the electrode layer 12 and the electrode layer 13 are restrained from being generated. As a result, a lowering in the capacitance of the capacitor 10 incorporated in the circuit board 1 is restrained.

According to the above-mentioned technique, a circuit board 1 excellent in reliability and performance is realized in which it is possible to effectively restrain generation of a crack at the time of drilling, exfoliation at the time of a test or practical use involving heating, and the resulting lowering in capacitance, in the capacitor 10.

While the capacitor 10 or the capacitor board 10a has the electrode layer 12 disposed directed to the insulating layer 21 side and has the electrode layer 13 disposed directed to the insulating layer 22 side here, it is natural that the electrode layer 13 may be disposed directed to the insulating layer 21 side and the electrode layer 12 may be disposed directed to the insulating layer 22 side. In this case, the coupling via 32 is formed in the insulating layer 22 in such a manner as to be coupled to the electrode layer 12 on the upper layer side, and electrical coupling between the electrode layer 12 and the conductor via 31 is realized by the coupling via 32 and the conductor layer 33 on the insulating layer 22 that is coupled to the conductor via 31 in the hole 30.

Though not illustrated, a build-up process of laminating an insulating layer of a resin or the like on the circuit board 1 formed as above and forming the insulating layer with a conductor via and a conductor layer may be conducted once or repeated multiple times, to obtain a circuit board including a desired number of wiring layers.

Now, a second embodiment will be described. The process of forming the hole 30 for forming the conductor via 31 (hole formation) may be performed after the build-up process is conducted once or repeated multiple times. Such an embodiment will be described here as the second embodiment.

FIGS. 11A and 11B and FIGS. 12A and 12B are figures illustrating an example of a method for forming a circuit board according to the second embodiment. FIGS. 11A and 11B and FIGS. 12A and 12B each illustrate schematically a section of a major part in each process in forming the circuit board according to the second embodiment.

Figure 11A:
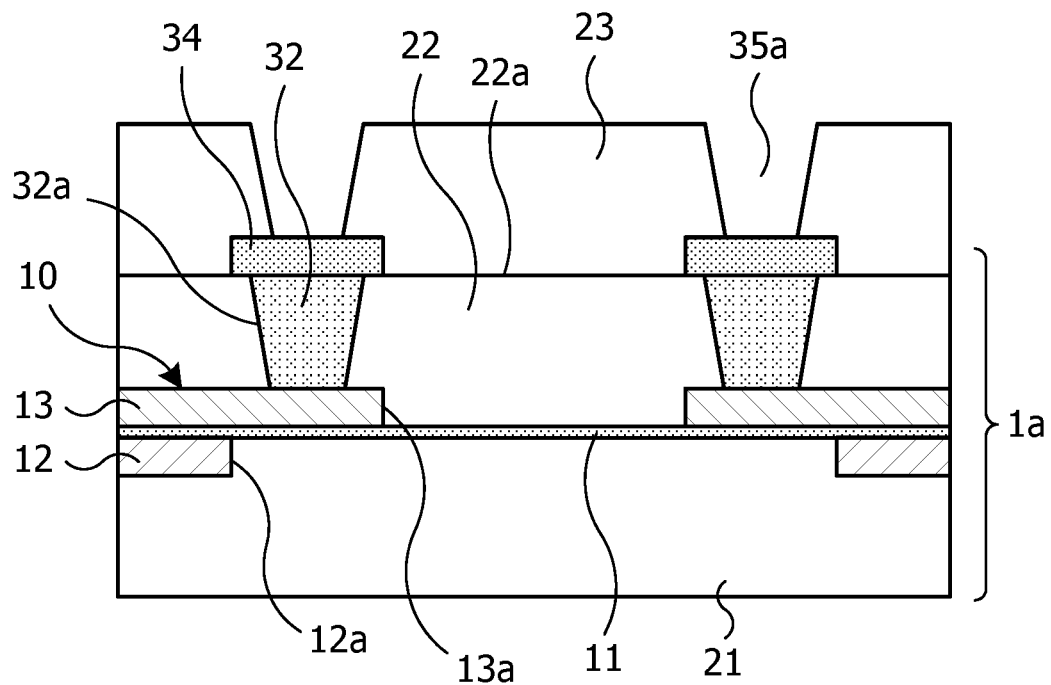
FIGS. 11A and 11B are figures (first ones) illustrating an example of a method for forming a circuit board according to a second embodiment.
Figure 11B:
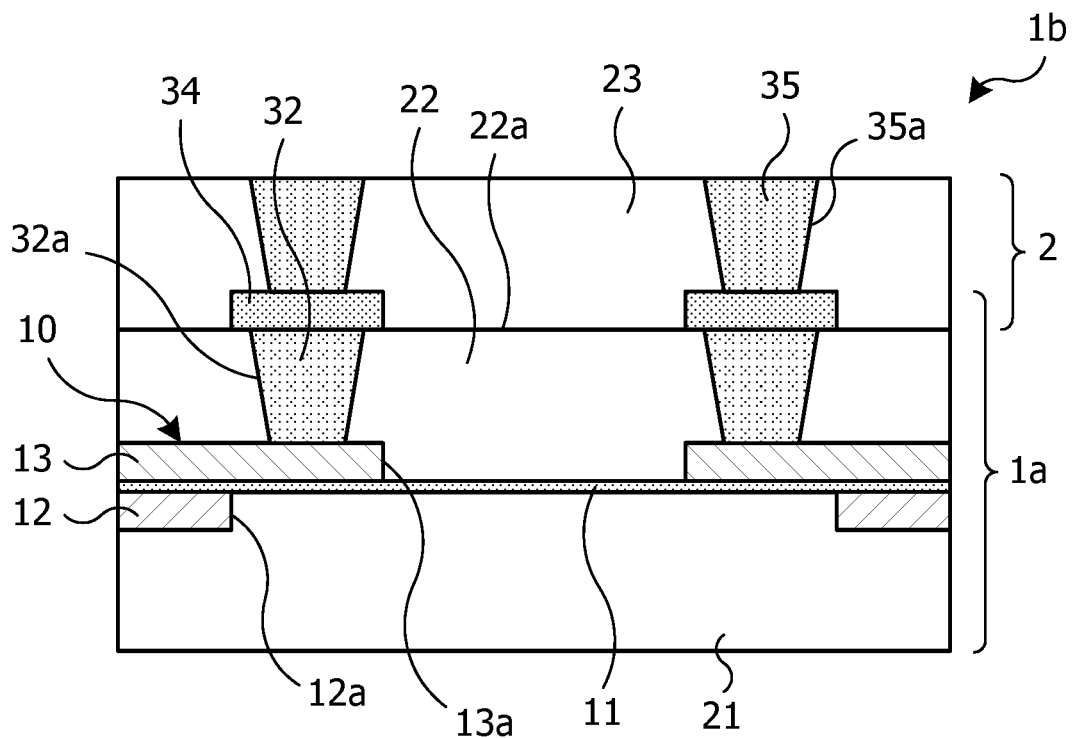

For example, after the processes of FIGS. 8A to 8D and FIGS. 9A and 9B described in the first embodiment above are performed, a build-up process as depicted in FIGS. 11A and 11B is carried out.

In this example, after the formation of the hole 32a depicted in FIG. 9A, a conductor material such as Cu is formed in the hole 32a and on the upper surface 22a of the insulating layer 22 by a plating method, and the conductor material formed on the upper surface 22a of the insulating layer 22 is patterned into a given shape by etching. This results in that a board 1a including the coupling via 32 and a conductor layer 34 provided thereon, as depicted in FIG. 11A, is obtained.

An insulating layer 23 is formed on such a board 1a, and a hole 35a is formed in the insulating layer 23, as illustrated in FIG. 11A. The insulating layer 23 is an insulating layer of a resin, a prepreg or the like, an insulating layer using an epoxy resin or the like. The formation of the hole 35a in the insulating layer 23 is performed by laser processing.

After the formation of the hole 35a, as illustrated in FIG. 11B, a conductor material such as Cu is formed in the thus formed hole 35a by a plating method, to form a coupling via 35 in the insulating layer 23. The coupling via 35 is electrically coupled to the electrode layer 13 the capacitor 10 through the conductor layer 34 and the coupling via 32.

The coupling via 35 formed in the insulating layer 23 may be a continuous conductor wall surrounding the conductor via 31 in the hole 30 in plan view, according to the example of FIG. 7A. Alternatively, the coupling via 35 may be configured to include a plurality of conductor vias surrounding the conductor via 31 in plan view, according to the example of FIG. 7B. In the process of FIG. 11A, the hole or holes 35a are formed in the insulating layer 23 in a shape according to the form (a conductor wall or a group of conductor vias) of the coupling via 35 to be formed in the process of FIG. 11B.

Figure 12A:
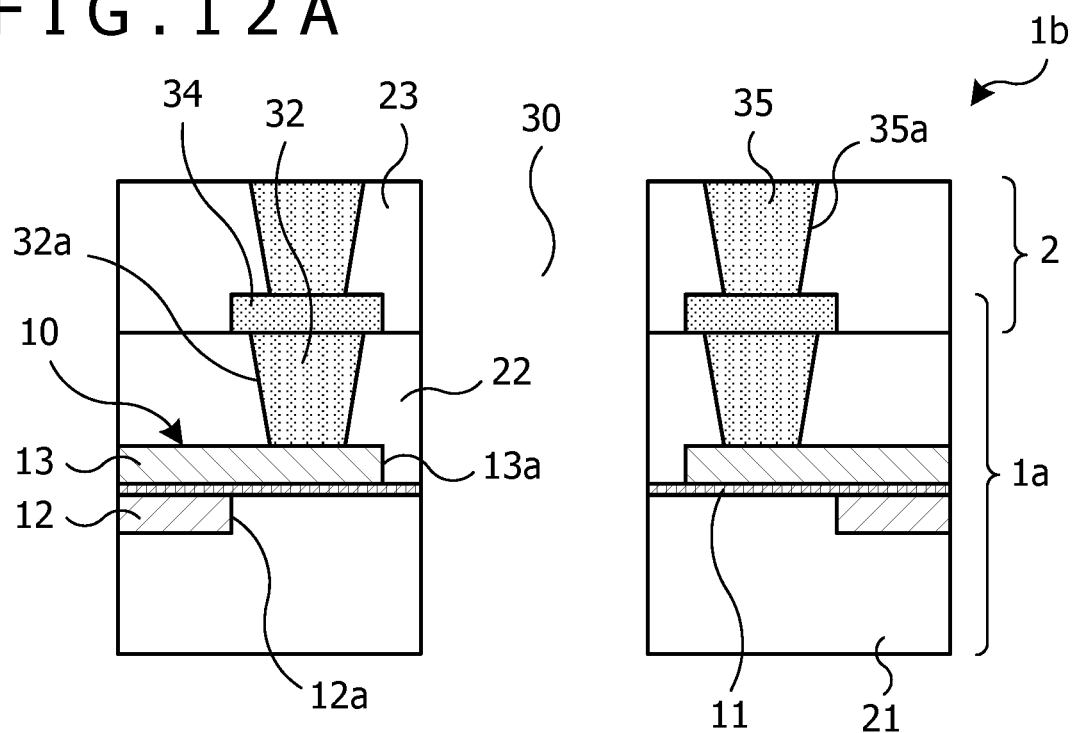
FIGS. 12A and 12B are figures (second ones) illustrating an example of the method for forming the circuit board according to the second embodiment.

By the processes as depicted in FIGS. 11A and 11B, a board 1b formed with a build-up layer 2 including the insulating layer 23 and the coupling via 35 is obtained. After the formation of the coupling via 35, a hole 30 penetrating the insulating layer 23, the insulating layer 22, the capacitor 10 and the insulating layer 21 is formed, as depicted in FIG. 12A, according to the example of FIG. 10A above. The hole 30 is formed at the position of the opening part 12a and the opening part 13a provided in the electrode layer 12 and the electrode layer 13 of the capacitor 10, in an opening size smaller than those of the opening part 12a and the opening part 13a, by drilling. Since the electrode layer 12 and the electrode layer 13 of the capacitor 10 are suppressed from being cut by the drill at the time of drilling, generation of a crack between the electrode layers and the dielectric layer 11 is restrained.

Figure 12B:
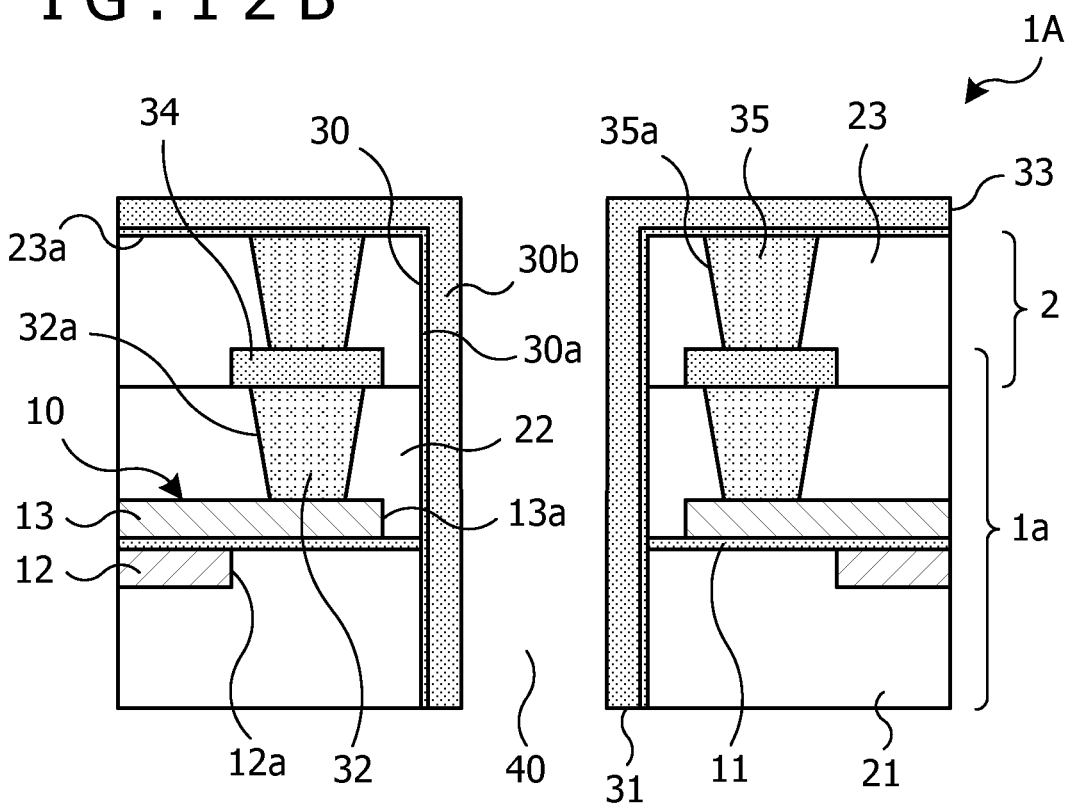

After the formation of the hole 30, a conductor material such as Cu is formed on an inner wall of the hole 30 by a plating method, as depicted in FIG. 12B, according to the example of FIG. 10B above. This results in that the conductor via 31 is formed on the inner wall of the hole 30. For example, a seed layer 30a is first formed by electroless plating, and then a plating layer 30b is formed by electroplating in which the seed layer 30a is used as a current supply layer, to form the conductor via 31 on the inner wall of the hole 30. At the time of formation of the conductor via 31, as illustrated in FIG. 12B, the seed layer 30a and the plating layer 30b are formed also on an upper surface 23a of the insulating layer 23. This results in that a conductor layer 33 is formed on the upper surface 23a of the insulating layer 23. The conductor layer 33 may be patterned into a given shape.

By the above-mentioned processes, there is obtained a circuit board 1A including a structure in which the electrode layer 13 of the capacitor 10 is electrically coupled to the conductor via 31 in the hole 30 through the coupling via 32, the conductor layer 34, the coupling via 35 and the conductor layer 33.

In the circuit board 1A, the cavity 40 in a central area of the conductor via 31 which is a conformal via may be filled with a resin (not illustrated) such as epoxy resin. In the circuit board 1A, the hole 30 may be filled with a conductor material, to form a filled via.

While an example in which the formation of a single build-up layer 2 is followed by the formation of the hole 30 by drilling and the formation the conductor via 31 in the hole 30 has been described here, the formation of the hole 30 and the conductor via 31 may be conducted after the formation of two or more build-up layers. The drilling enables formation of a hole 30 in a given opening size even when the number of layers in the circuit board is increased, so that a lowering in the degree of freedom in design in realizing a multilayer configuration may be restrained.

As has been described in the second embodiment above, the formation of the hole 30 and the conductor via 31 may be conducted after the build-up process is performed once or repeated multiple times, to obtain, for example, the circuit board 1A incorporating the capacitor 10.

Figure 13:
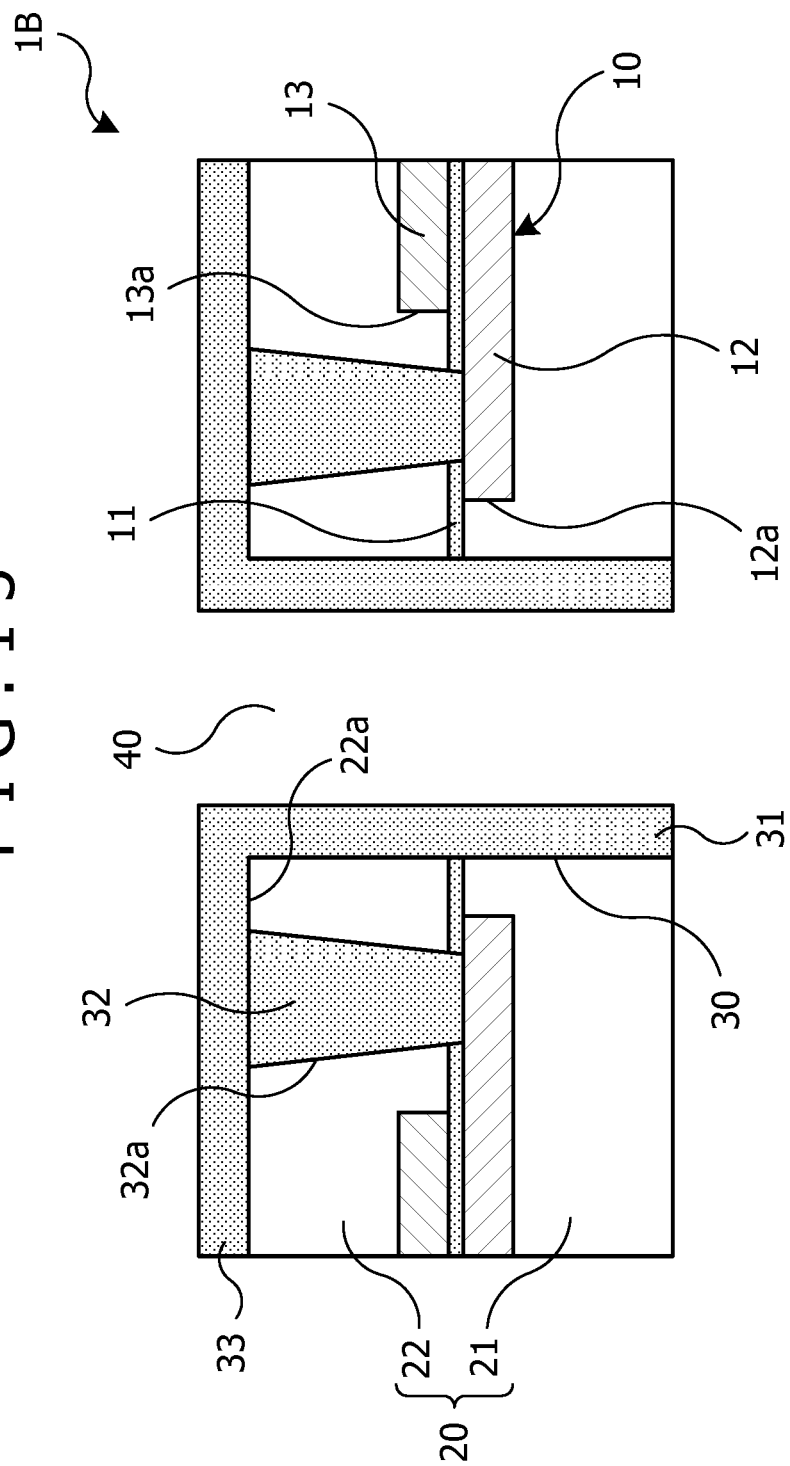
FIG. 13 is a figure illustrating an example of a circuit board according to a third embodiment.

Now, a third embodiment will be described. FIG. 13 is a figure illustrating an example of a circuit board according to the third embodiment. FIG. 13 illustrates schematically a section of a major part in the example of the circuit board according to the third embodiment.

A circuit board 1B depicted in FIG. 13 differs from the circuit board 1, described in the first embodiment above, in that the coupling via 32 electrically coupling the conductor layer 33 on the insulating layer 22 and the capacitor 10 to each other penetrates the dielectric layer 11 of the capacitor 10 and is coupled to the electrode layer 12 on the lower side.

In the circuit board 1B, the opening layer 12a is provided in a given region of the electrode layer 12 of the capacitor 10, and the opening part 13a larger in opening size than the opening part 12a is provided in a given region of the electrode layer 13.

The conductor via 31 provided in the hole 30 penetrating the insulating layer 22, the capacitor 10 and the insulating layer 21 is provided on the inner side of edges of the opening part 12a and the opening part 13a in the electrode layer 12 and the electrode layer 13 of the capacitor 10, and is in a non-contact relation with the electrode layer 12 and the electrode layer 13.

The coupling via 32 provided in the insulating layer 22 is provided on the inner side of an edge of the opening part 13a in the electrode layer 13 and on the outer side of an edge of the opening part 12a in the electrode layer 12, penetrates the dielectric layer 11, and is coupled to the electrode layer 12.

In the circuit board 1B, the conductor via 31 in the hole 30 is electrically coupled to the electrode layer 12 of the capacitor 10 through the conductor layer 33 on the insulating layer 22 and the coupling via 32 in the insulating layer 22. In the circuit board 1B, the cavity 40 may be filled with a resin (not illustrated) such as epoxy resin. A filled via may be formed in the hole 30.

As in the circuit board 1 descried in the first embodiment above and the circuit board 1B described in the third embodiment, the conductor via 31 in the hole 30 may be selectively and electrically coupled with both of the electrode layer 12 and the electrode layer 13 of the capacitor 10, by use of the conductor layer 33 and the coupling via 32.

In regard of the circuit board 1B described in the third embodiment, the formation of the hole 30 and the conductor via 31 may be performed after the build-up process is conducted once or repeated multiple times, to obtain, for example, the circuit board 1B incorporating the capacitor 10, according to the example described in the second embodiment.

Figure 14:
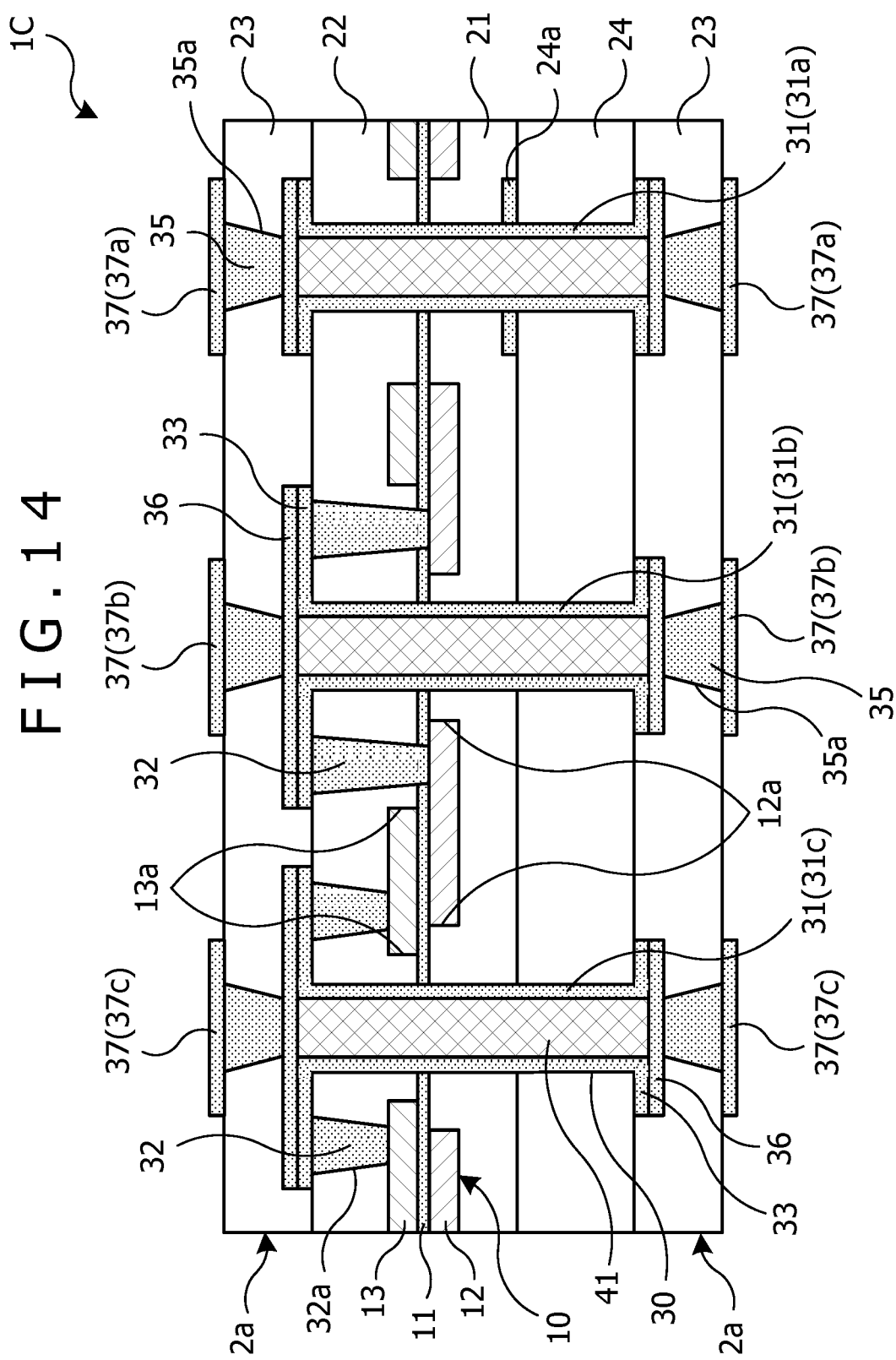
FIG. 14 is a figure illustrating an example of a circuit board according to a fourth embodiment.

Now, a fourth embodiment will be described. FIG. 14 is a figure illustrating an example of a circuit board according to the fourth embodiment. FIG. 14 illustrates schematically a section of a major part in the example of the circuit board according to the fourth embodiment.

A circuit board 1C depicted in FIG. 14 includes a base board 24 including a wiring 24a, the insulating layer 21 provided on the base board 24, the capacitor 10 provided on the insulating layer 21, and the insulating layer 22 provided on the capacitor 10. In the insulating layer 22, there are provided the coupling via 32a which is coupled to the electrode layer 13 of the capacitor 10, and the coupling via 32 which penetrates the dielectric layer 11 and is coupled to the electrode layer 12. A plurality of (here, as an example, three) holes 30 are provided in such a manner as to penetrate the insulating layer 22, the dielectric layer 11 of the capacitor 10, the insulating layer 21 and the base board 24. On an inner wall of each hole 30, the conductor via 31 in a conformal via shape is provided.

The electrode layer 12 and the electrode layer 13 of the capacitor 10 are provided respectively with the opening part 12a and the opening part 13a which are larger than the conductor via 31. This realizes a structure in which the electrode layer 12 and the electrode layer 13 of the capacitor 10 are both out of contact with the conductor via 31 in the hole 30. Electrical coupling of the conductor via 31 with the electrode layer 12 and the electrode layer 13 of the capacitor 10 is performed through the conductor layer 33 provided on the insulating layer 22 and the coupling via 32 provided in the insulating layer 22.

The inside of the conductor via 31 is filled with a resin 41. Conductor layers 36 are provided on the upper and lower sides of the conduct via 31 filled with the resin 41. The conductor layers 36 are formed, for example, by use of a plating method (so-called lid-plating). The conductor layer 33 provided on the insulating layer 22 and the conductor layer 33 provided beneath the base board 24 are respectively patterned into given shapes together with the conductor layers 36, after the formation of the conductor layers 36.

Build-up layers 2a are respectively provided on the insulating layer 22 and beneath the base board 24. The build-up layers 2a each include the insulating layer 23, the coupling via 35 provided in the hole 35a penetrating the insulating layer 23 and reaching the conductor layer 36 on the conductor via 31, and a conductor layer 37 provided on the coupling via 35. For example, the conductor layer 37 is used as a terminal for external coupling of the circuit board 1C.

FIG. 14 illustrate, as an example, three conductor vies 31, for example, a conductor via 31a which is not electrically coupled to the capacitor 10, and a conductor via 31b and a conductor via 31c which are electrically coupled to the capacitor 10. In the circuit board 1C, the conductor layer 37 (terminal 37a) which is electrically coupled to the conductor via 31a is used as a signal terminal. Of the conductor layer 37 (terminal 37b) electrically coupled to the conductor via 31b and the conductor layer 37 (terminal 37c) electrically coupled to the conductor via 31c, one is used as a power supply terminal and the other is used as a GND terminal. This results in that, of the electrode layer 12 electrically coupled to the conductor via 31b and the electrode layer 13 electrically coupled to the conductor via 31c, of the capacitor 10, one is set to a power supply potential and the other is set to a GND potential.

In the circuit board 1C, the electrode layer 12 and the electrode layer 13 of the capacitor 10 are provided with the opening part 12a and the opening part 13a larger in opening size than the conductor via 31, and electrical coupling between the capacitor 10 and the conductor via 31 is performed using the coupling via 32. This realizes a circuit board 1C excellent in reliability and performance in which it is possible to effectively restrain generation of a crack, at the time of drilling, exfoliation at the time of heating due to such a crack, and the resulting lowering in capacitance, in the capacitor 10.

While a circuit board 1C in which a single build-up layer 2a each is provided on the insulating layer 22 side and on the base board 24 side has been described here as an example, the number of the build-up layer or layers 2a is not limited to this. The conductor vias 31 (31a, 31b, 31c) may be configured as filled vias.

Now, a fifth embodiment will be described. A variety of electronic parts, for example, semiconductor devices such as semiconductor chips and semiconductor packages may be mounted on the circuit boards 1, 1A, 1B, 1C and the like as described in the first to fourth embodiments.

Figure 15:
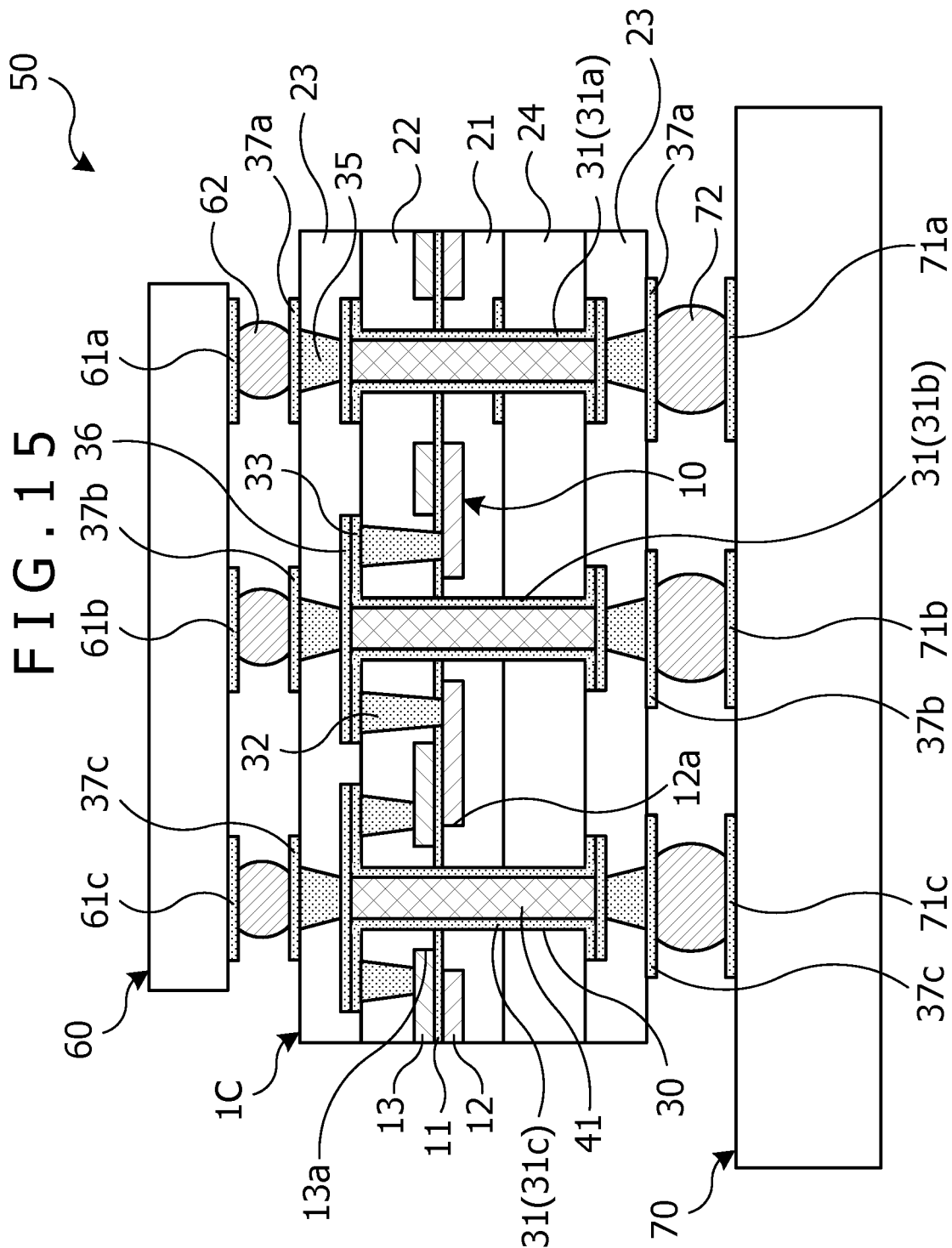
FIG. 15 is a figure illustrating an example of n electronic device according to a fifth embodiment.

FIG. 15 is a figure illustrating an example of an electronic device according to the fifth embodiment. FIG. 15 illustrates schematically a section of a major part in the example of the electronic device according to the fifth embodiment. The circuit board 1C described in the fourth embodiment is taken here as an example. An electronic device 50 depicted in FIG. 15 includes the circuit board 1C, and an electronic part 60 mounted on the circuit board 1C. The electronic device 50 includes a configuration in which the circuit board 1C with the electronic part 60 mounted thereon is mounted on a circuit board 70.

The electronic part 60 is, for example, a semiconductor chip, or a semiconductor package which includes a semiconductor chip. Such an electronic part 60 is mounted on the circuit board 1C. The terminal 37a, the terminal 37b and the terminal 37c provided on the side of that surface of the circuit board 1C on which to mount the electronic part 60 and a terminal 61a, a terminal 61b and a terminal 61c provided in the electronic part 60 are bonded through bumps 62 using a solder or the like. This realizes electrical coupling between the electronic part 60 and the circuit board 1C. The terminal 61a of the electronic part 60 is a signal terminal. Of the terminal 61b and the terminal 61c of the electronic part 60, for example, the terminal 61b is a power supply terminal and the terminal 61c is a GND terminal.

The circuit board 1C on which the electronic part 60 is thus mounted is further mounted on the circuit board 70. The circuit board 70 is, for example, a printed circuit board. The terminal 37a, the terminal 37b and the terminal 37c which are provided on the circuit board 70 side of the circuit board 1C and a terminal 71a, a terminal 71b and a terminal 71c which are provided on the circuit board 70 are bonded through bumps 72 using a solder or the like. This results in that the circuit board 1C with the electronic part 60 mounted thereon and the circuit board 70 are electrically coupled. The terminal 71a of the circuit board 70 is a signal terminal. Of the terminal 71b and the terminal 71c of the circuit board 70, for example, the terminal 71b is a power supply terminal and the terminal 71c is a GND terminal.

In the electronic device 50, power is supplied from the circuit board 70 to the electronic part 60 through the bumps 72, the circuit board 1C and the bumps 62. The capacitor 10 is provided on a power supply line from the circuit board 70 to the electronic part 60. In this example, the electrode layer 12 of the capacitor 10 is set to a power supply potential, and the electrode layer 13 is set to, a GND potential. With the capacitor 10 provided on the power supply line, a reduction in power supply impedance, variations in power supply voltage, and generation of high-frequency noises are restrained, and a stable operation of the electronic part 60 is realized.

In the circuit board 1C, the electrode layer 12 and the electrode layer 13 of the capacitor 10 are provided with the opening part 12a and the opening part 13a larger in opening size than the conductor via 31, and electrical coupling between the capacitor 10 and the conductor via 31 is performed using the coupling via 32. This results in realization of a circuit board 1C excellent in reliability and performance in which it is possible to effectively restrain generation of a crack at the time of drilling, exfoliation at the time of a test or practical use involving heating, and the resulting lowering in capacitance, in the capacitor 10. The use of such a circuit board 1C realizes an electronic device 50 excellent in reliability and performance against heating.

The electronic device 50 may be further mounted on any of various electronic apparatuses (also called electronic devices). For example, the electronic device 50 may be mounted on various electronic apparatuses such as computers (personal computers, supercomputers, servers, etc.), smartphones, mobile phones, tablet terminals, sensors, cameras, audio apparatuses, measuring instruments, inspection devices, and manufacturing equipment.

FIG. 16 is a figure illustrating an example of an electronic apparatus according to the fifth embodiment. FIG. 16 illustrates schematically the example of the electronic apparatus. As illustrated in FIG. 16, the electronic device 50 as above is mounted (incorporated) on (in) an electronic apparatus 80. In the circuit board 1C used for the electronic device 50, it is possible to effectively restrain generation of a crack at the time of drilling, exfoliation at the time of a test or practical use involving heating, and the resulting lowering in capacitance, in the capacitor 10. This realizes an electronic device 50 excellent in reliability and performance against heating, and realizes an electronic apparatus 80 on which such an electronic device 50 is mounted and which is excellent in reliability and performance.

The foregoing merely describes examples. A multiplicity of further modifications and changes are possible by a person skilled in the art, the present, technology is not to be limited to the accurate configurations and application examples described above, and all the corresponding modifications and the equivalence thereof are in the scope of the present technology defined by claims and the equivalence thereof.

Note. According to one aspect of the above embodiments, a circuit board includes: an insulating layer; a capacitor which is provided in the insulating layer and includes a dielectric layer, a first conductor layer provided on a first surface of the dielectric layer and including a first opening part, and a second conductor layer provided on a second surface opposite to the first surface of the dielectric layer and including a second opening part at a position corresponding to the first opening part, the second opening part having a different size than the first opening part in plan view; a first conductor via provided in the insulating layer, penetrating the dielectric layer, the first opening part and the second opening part, and being smaller than the first opening part and the second opening part in plan view; a second conductor via, provided in the insulating layer and making contact with the second conductor layer; and a third conductor layer provided on the insulating layer and electrically coupled to the first conductor via and the second conductor via.

All examples and conditional language, provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A circuit board comprising:
an insulating layer;
a capacitor which is provided in the insulating layer and includes a dielectric layer, a first conductor layer provided on a first surface of the dielectric layer and including a first opening part, and a second conductor layer provided on a second surface opposite to the first surface of the dielectric layer and including a second opening part at a position corresponding to the first opening part;
a first conductor via provided in the insulating layer, penetrating the dielectric layer, the first opening part and the second opening part, and being smaller than the first opening part and the second opening part in plan view, the first conductor via is not directly electrically coupled to the first conductor layer and the second conductor layer, the first conductor via includes a central area that is not conductive;
a second conductor via provided in the insulating layer and making contact with the second conductor layer; and
a third conductor layer provided on the insulating layer and electrically coupled to the first conductor via and the second conductor via.

2. The circuit board of claim 1, wherein the second conductor via surrounds the first conductor via in plan view.

3. The circuit board of claim 2, wherein the second conductor via is a continuous conductor wall.

4. The circuit board of claim 2, wherein the second conductor via includes a plurality of conductor vias.

5. The circuit board of claim 1,
wherein the second opening part is smaller than the first opening part in plan view, and
the second conductor via penetrates the dielectric layer and makes contact with the second conductor layer.

6. The circuit board of claim 1, wherein the first conductor via makes contact with the dielectric layer.

7. The circuit board of claim 1, further comprising:
a third conductor via provided between the second conductor via and the third conductor layer in the insulating layer and is electrically coupled to the second conductor via and the third conductor layer.

8. The circuit board of claim 1, wherein one of the first conductor layer and the second conductor layer includes copper, and the other includes nickel.

9. An electronic device comprising:
a circuit board; and
an electronic part mounted on the circuit board,
wherein the circuit board includes
an insulating layer,
a capacitor which is provided in the insulating layer and includes a dielectric layer, a first conductor layer provided on a first surface of the dielectric layer and including a first opening part, and a second conductor layer provided on a second surface opposite to the first surface of the dielectric layer and including a second opening part at a position corresponding to the first opening part,
a first conductor via provided in the insulating layer, penetrating the dielectric layer, the first opening part and the second opening part, and being smaller than the first opening part and the second opening part in plan view, the first conductor via is not directly electrically coupled to the first conductor layer and the second conductor layer, the first conductor via includes a central area that is not conductive, a second conductor via provided in the insulating layer and making contact with the second conductor layer, and a third conductor layer provided on the insulating layer and electrically coupled to the first conductor via and the second conductor via.

10. The circuit board of claim 1, wherein the central area of the first conductor layer is one of a cavity and cavity filled with resin.

* * * * *